(12) United States Patent
Beintner et al.

(10) Patent No.: US 8,963,294 B2
(45) Date of Patent: Feb. 24, 2015

(54) DENSE CHEVRON FINFET AND METHOD OF MANUFACTURING SAME

(75) Inventors: Jochen Beintner, Wappingers Falls, NY (US); Thomas Ludwig, Sindelfingen (DE); Edward Joseph Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 1977 days.

(21) Appl. No.: 11/857,806

(22) Filed: Sep. 19, 2007

(65) Prior Publication Data

US 2008/0006852 A1 Jan. 10, 2008

Related U.S. Application Data

(62) Division of application No. 11/162,663, filed on Sep. 19, 2005, now Pat. No. 7,323,374.

(51) Int. Cl.
| | |
|---|---|
| *H01L 29/04* | (2006.01) |
| *H01L 21/84* | (2006.01) |
| *H01L 27/12* | (2006.01) |
| *H01L 29/66* | (2006.01) |
| *H01L 29/78* | (2006.01) |

(52) U.S. Cl.
CPC .......... *H01L 21/845* (2013.01); *H01L 27/1211* (2013.01); *H01L 29/66795* (2013.01); *H01L 29/785* (2013.01)
USPC ........... 257/627; 257/204; 257/347; 257/348; 257/628; 257/E21.014

(58) Field of Classification Search
CPC .............. H01L 21/845; H01L 27/1211; H01L 29/66795; H01L 29/785
USPC ............ 257/204, 206, 216, 67, 69, 255, 527, 257/627, 628, E21.571, E21.014, 347, 521, 257/E31.04, 351, 348
See application file for complete search history.

(56) References Cited

U.S. PATENT DOCUMENTS

| | | | |
|---|---|---|---|
| 5,231,319 A * | 7/1993 | Crafts et al. | ................... 327/277 |
| 6,380,007 B1 | 4/2002 | Koyama | |

(Continued)

FOREIGN PATENT DOCUMENTS

| | | |
|---|---|---|
| KR | UPAP2005-85052 | 8/2005 |
| WO | 2004061972 A1 | 7/2004 |

OTHER PUBLICATIONS

Chang et al. Extremely Scaled Silicon Nano-CMOS Devices. Proceedings of the IEEE, vol. 91, No. 11, 2003, pp. 1860-1873.*

(Continued)

*Primary Examiner* — Galina Yushina
(74) *Attorney, Agent, or Firm* — Schmeiser, Olsen & Watts; Michael Lestrange

(57) ABSTRACT

A method, structure and alignment procedure, for forming a finFET. The method including, defining a first fin of the finFET with a first mask and defining a second fin of the finFET with a second mask. The structure including integral first and second fins of single-crystal semiconductor material and longitudinal axes of the first and second fins aligned in the same crystal direction but offset from each other. The alignment procedure including simultaneously aligning alignment marks on a gate mask to alignment targets formed separately by a first masked used to define the first fin and a second mask used to define the second fin.

14 Claims, 21 Drawing Sheets

(56) References Cited

U.S. PATENT DOCUMENTS

| | | |
|---|---|---|
| 6,468,887 B2 | 10/2002 | Iwasa et al. |
| 6,706,571 B1 * | 3/2004 | Yu et al. .................. 438/157 |
| 6,794,718 B2 | 9/2004 | Nowak et al. |
| 6,867,460 B1 * | 3/2005 | Anderson et al. ............ 257/351 |
| 7,241,653 B2 * | 7/2007 | Hareland et al. ............ 438/199 |
| 2003/0006410 A1 | 1/2003 | Doyle |
| 2003/0102518 A1 * | 6/2003 | Fried et al. .................. 257/401 |
| 2003/0197194 A1 | 10/2003 | Fried et al. |
| 2004/0038464 A1 * | 2/2004 | Fried et al. .................. 438/151 |
| 2004/0063286 A1 * | 4/2004 | Kim et al. .................... 438/283 |
| 2004/0100306 A1 | 5/2004 | Krivokapic et al. |
| 2004/0119100 A1 * | 6/2004 | Nowak et al. ................ 257/204 |
| 2004/0150029 A1 | 8/2004 | Lee |
| 2004/0266083 A1 * | 12/2004 | Hareland et al. ............. 438/199 |
| 2005/0121412 A1 * | 6/2005 | Beintner et al. ............... 216/11 |
| 2005/0153485 A1 | 7/2005 | Ahmed et al. |
| 2005/0269629 A1 * | 12/2005 | Lee et al. ..................... 257/327 |
| 2005/0275040 A1 * | 12/2005 | Anderson et al. ............. 257/390 |

OTHER PUBLICATIONS

Poiroux et al. Multiple Gate Devices: Advantages and Challenges. Microelectronic Engineering, 80 (2005), pp. 378-385.*

European Patent Office Search Report dated Jul. 15, 2009—Reference BUR920050024EP1, Application No./Patent No. 06825028.1-1528 / 1935020—PCT/US2006036575.

Materials for Information Disclosure Statement; BUR920050024KR1; Dated Aug. 16, 2010. 2 pages.

* cited by examiner

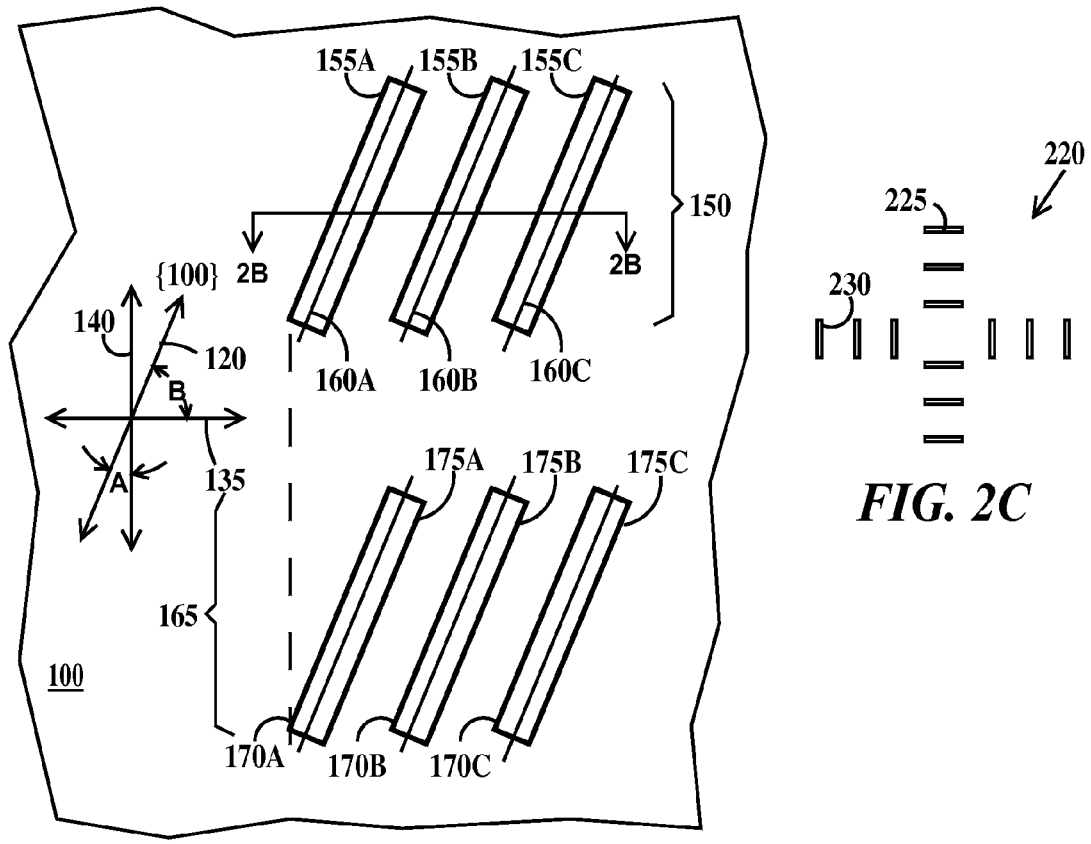
*FIG. 2A*
*FIG. 2C*
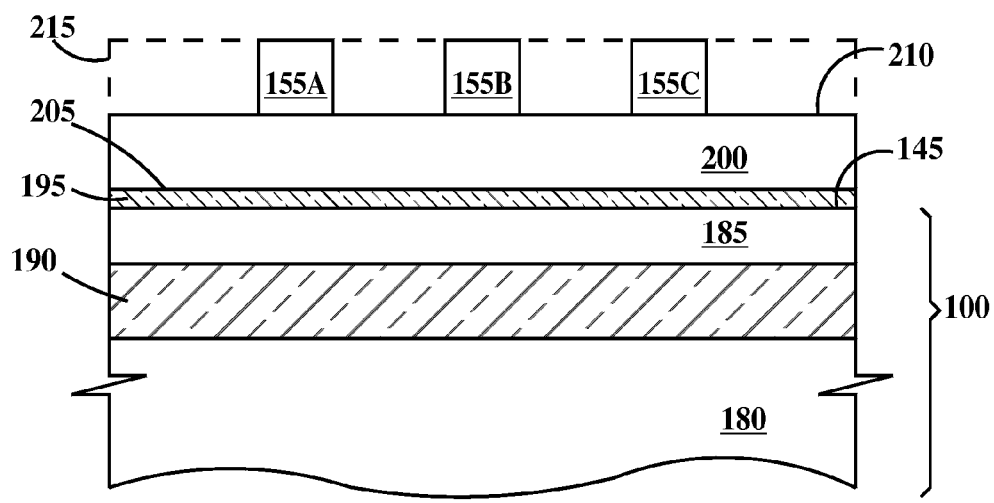
*FIG. 2B*

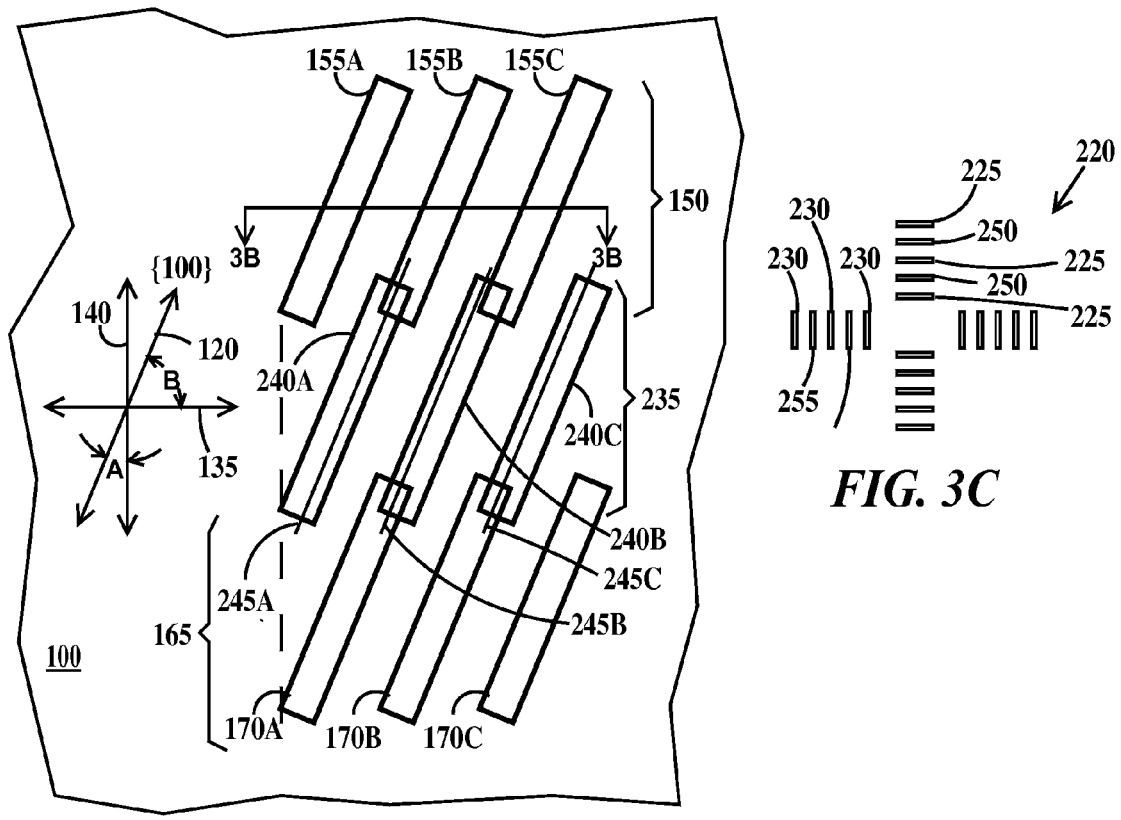
*FIG. 3A*
*FIG. 3C*
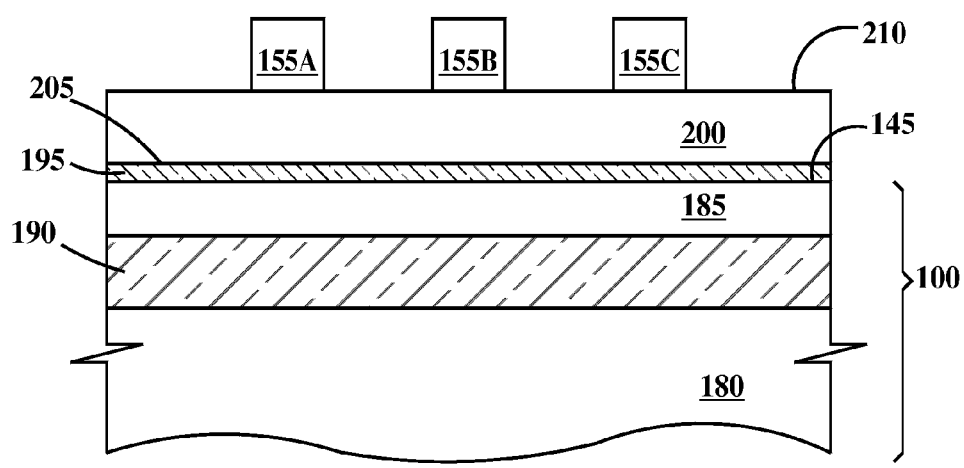
*FIG. 3B*

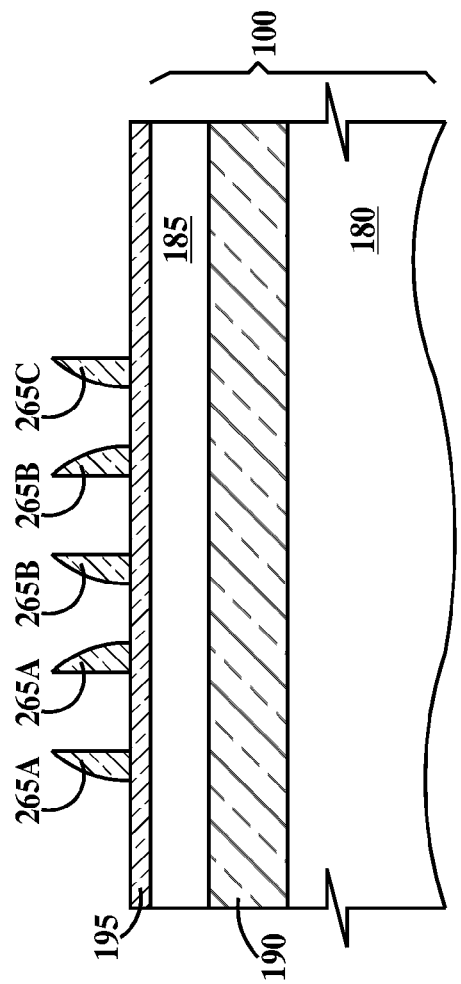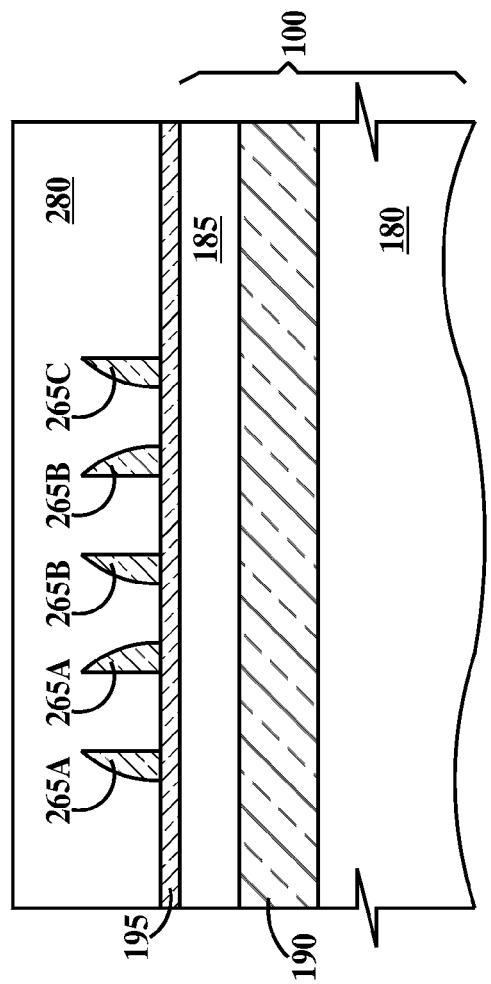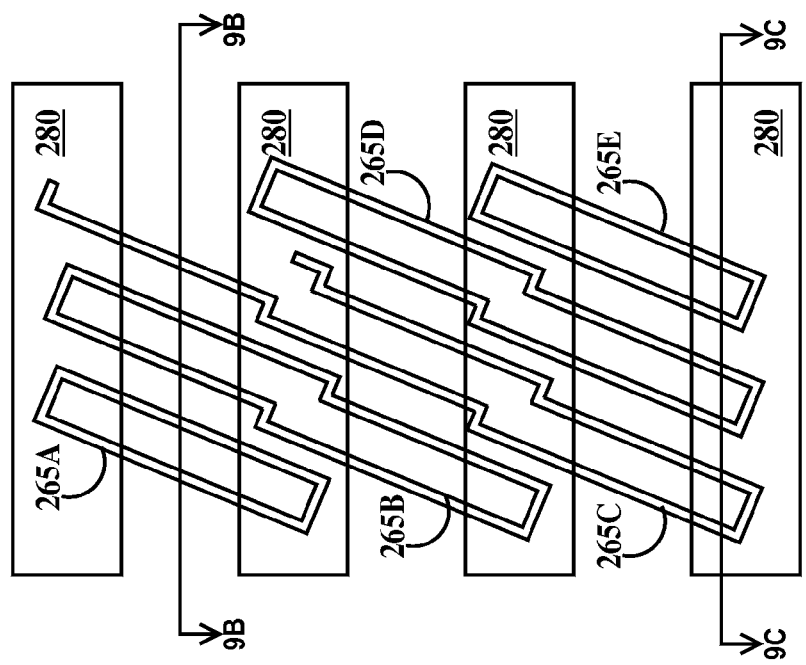

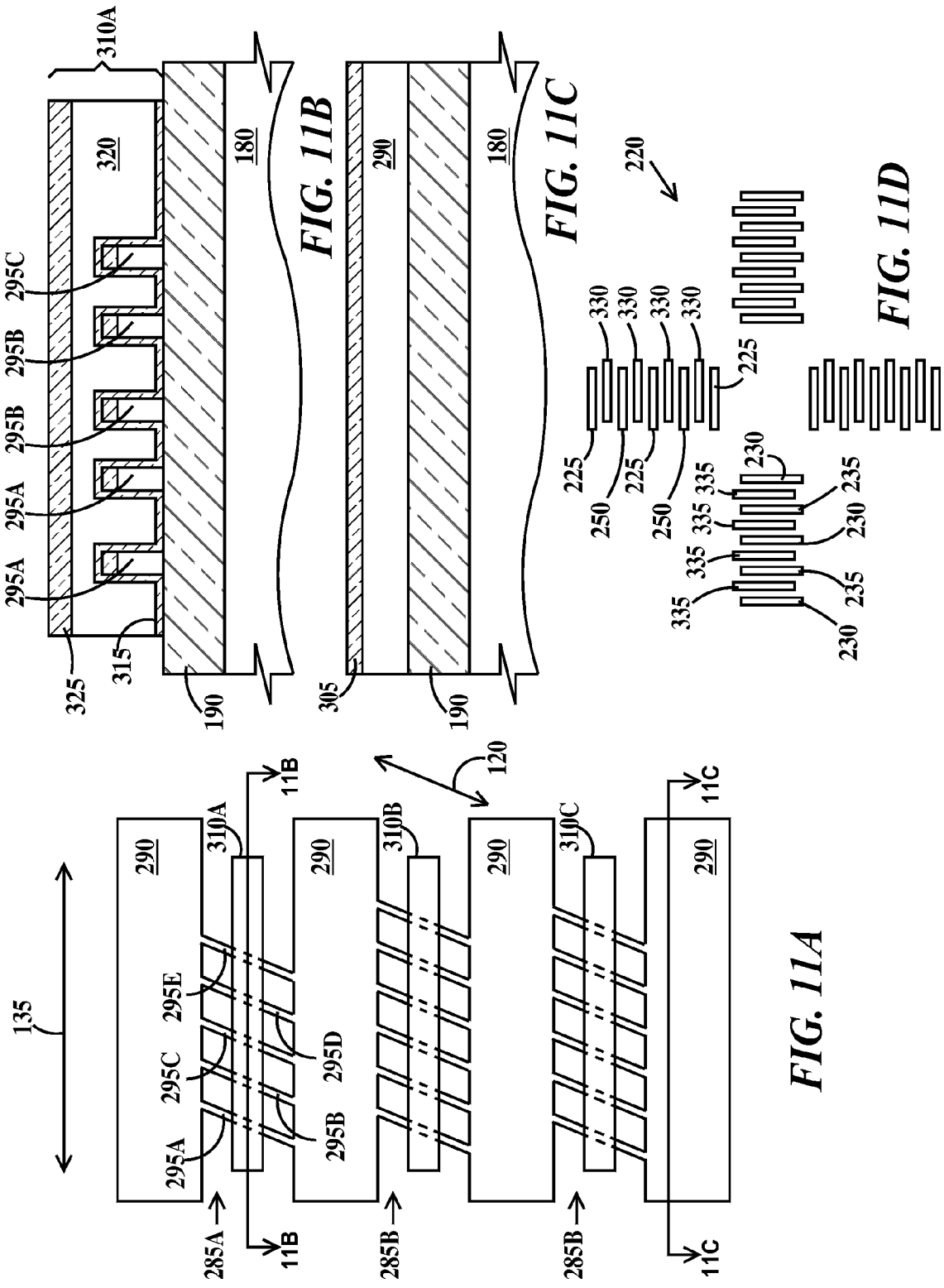

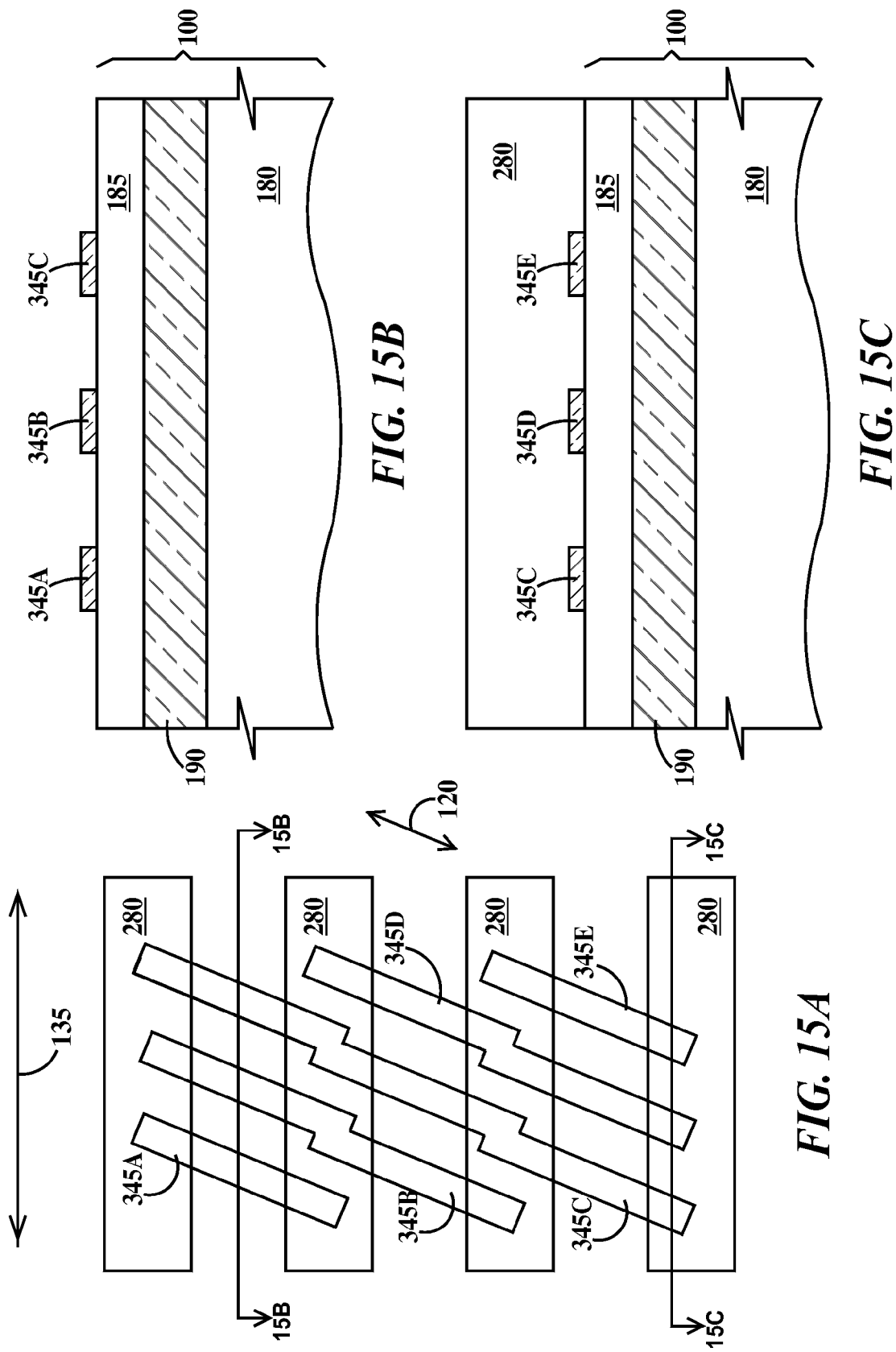

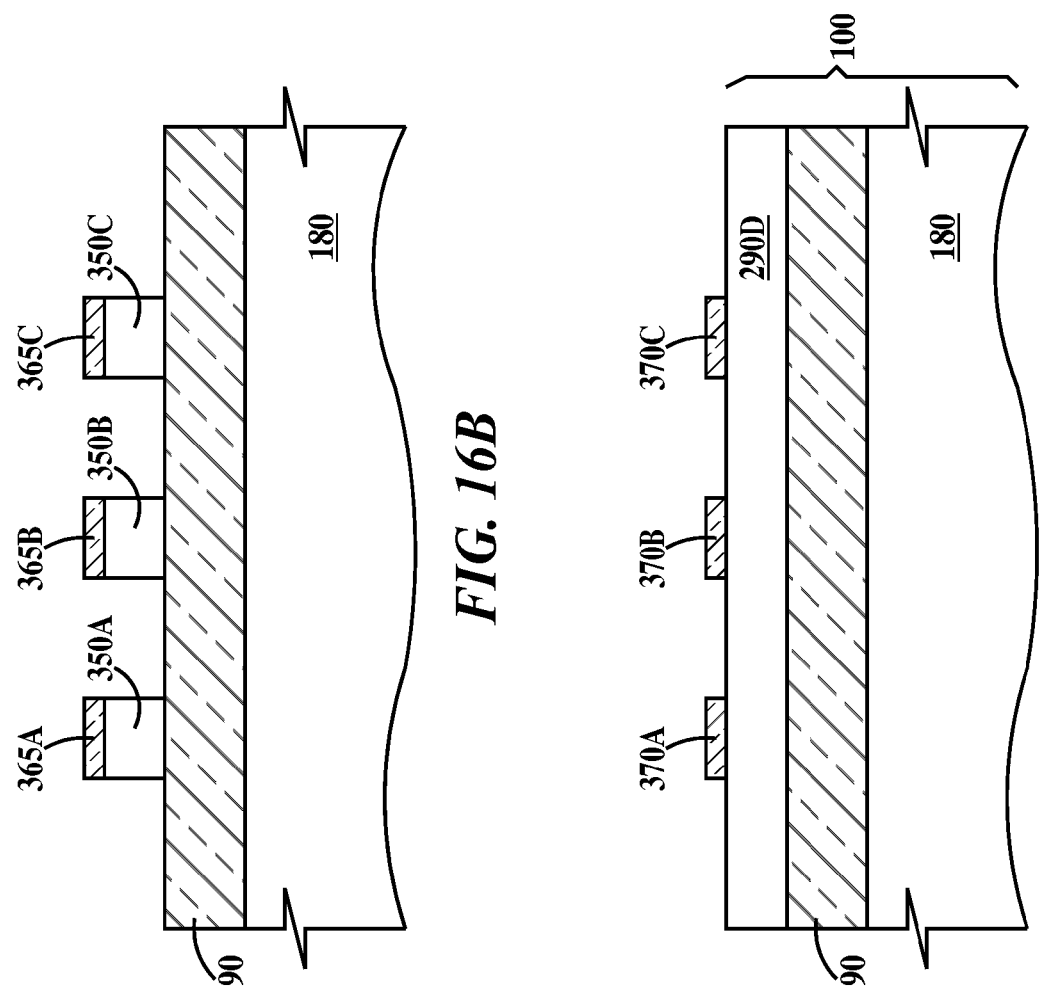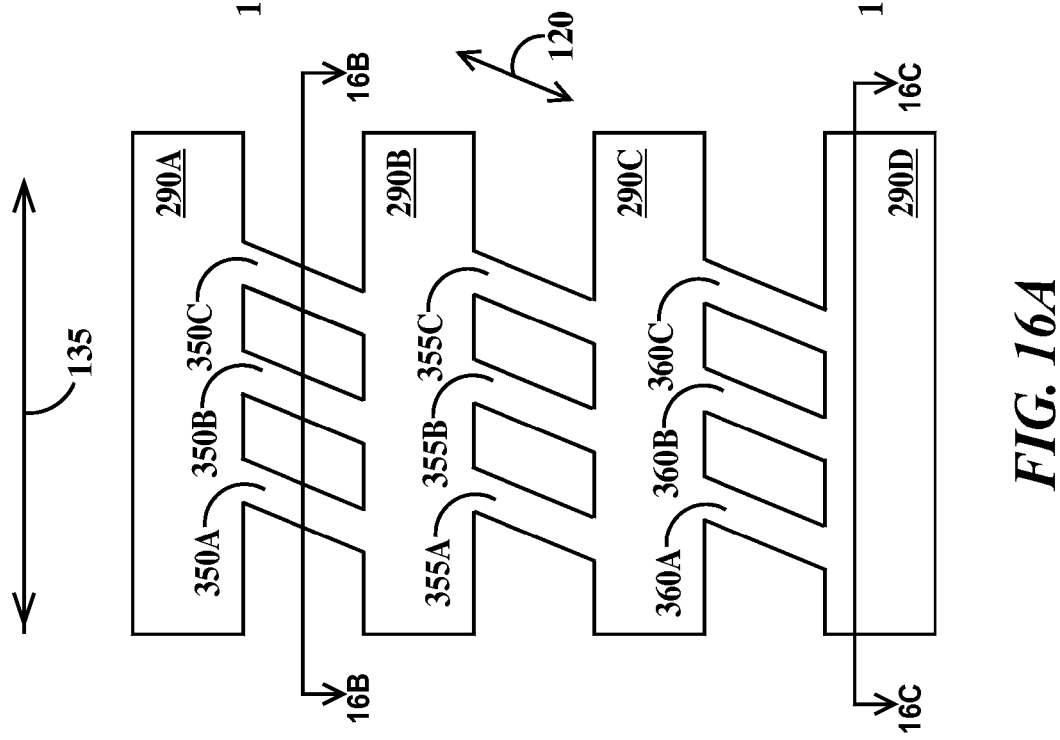

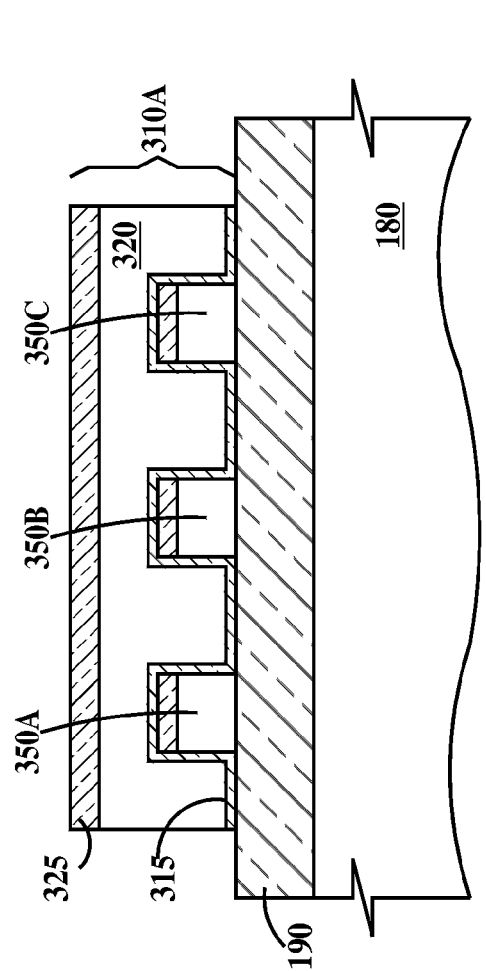
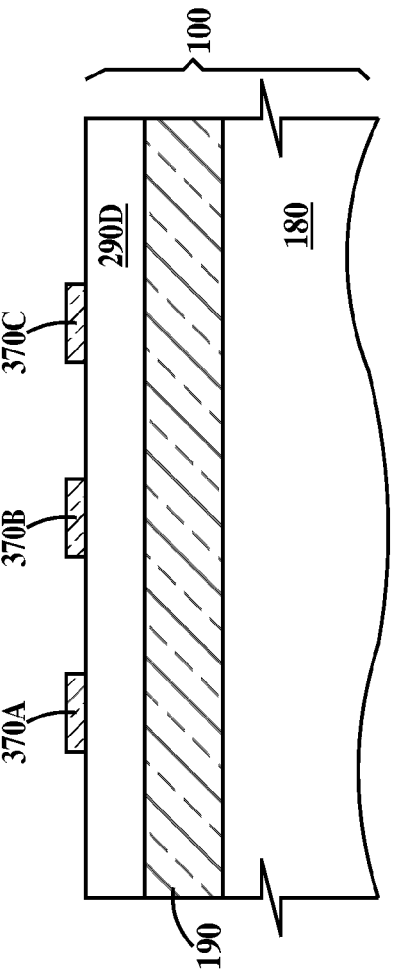
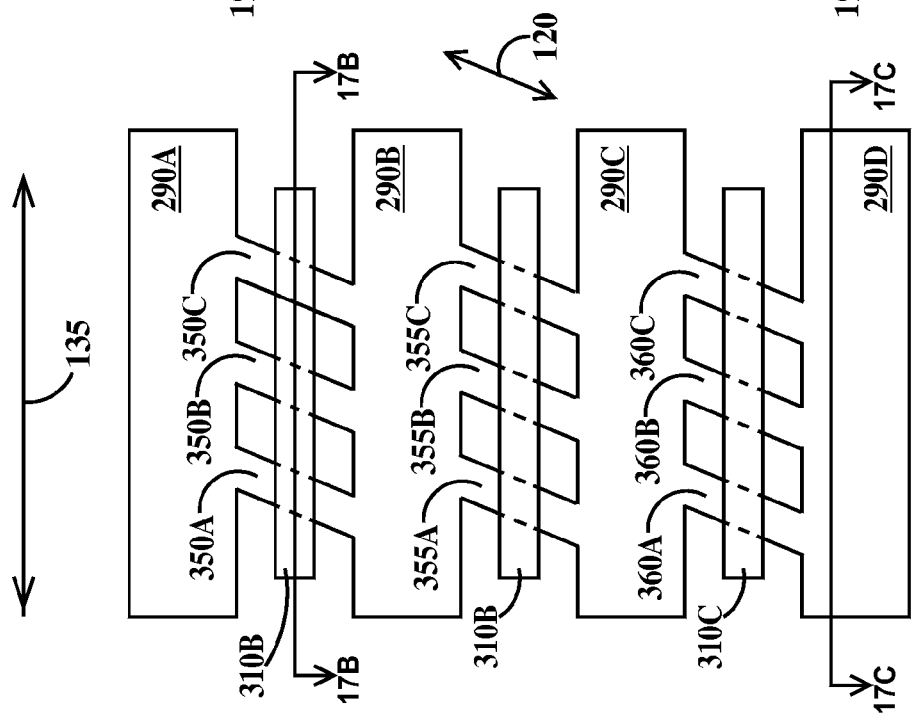

DENSE CHEVRON FINFET AND METHOD OF MANUFACTURING SAME

RELATED APPLICATIONS

This application is a division of co-pending U.S. patent application Ser. No. 11/162,663 filed on Sep. 19, 2005.

FIELD OF THE INVENTION

The present invention relates to the field of semiconductor structures and processing; more specifically, it relates to chevron finFET devices and methods of manufacturing finFET devices.

BACKGROUND OF THE INVENTION

FinFETs are field-effect transistors (FET)s where the body of the FET is a block or fin of single-crystal semiconductor material and gates are formed on sidewalls of the fin. Chevron finFETs are finFETs where the N channel finFETs (NfinFET)s and P-channel finFETs (PfinFET)s are formed on the same single crystal substrate, but at an angle to one another to take advantage of the differences in inversion carrier mobility's of NFETs and PFETs in different planes of single crystal semiconductor substrates. Since only one type of finFET, either the NfinFET or the PfinFET can be formed from orthogonal images (with respect to the sides of a rectangular integrated circuit chip) on a mask used in the fabrication of chevron finFET devices, by necessity, either the NfinFET or the PfinFET must be formed from non-orthogonal images. Not only is precision transfer of non-orthogonal mask images into a photoresist layer on a substrate difficult to control, but also various optical aberrations occur to non-orthogonal images that do not occur to orthogonal images frustrating methodologies to increase the density of chevron finFETs achievable with current fabrication schemes.

Therefore, there is a need for dense chevron finFET devices and methods of malting dense chevron finFET devices.

SUMMARY OF THE INVENTION

A method for forming a finFET includes, defining a first fin of the finFET with a first mask and defining a second fin of the finFET with a second mask. A finFET structure includes integral first and second fins being single-crystal semiconductor material and longitudinal axes of the first and second fins aligned in the same crystal direction but offset from each other. An alignment procedure for forming finFETs using two fin masks includes simultaneously aligning alignment marks on a gate mask to alignment targets formed separately by a first masked used to define the first fin and a second mask used to define the second fin.

A first aspect of the present invention is a method, comprising: providing a substrate having an insulating layer formed on a top surface of a bulk substrate and a single-crystal semiconductor layer formed on a top surface of the insulating layer; aligning a second fin pattern on a second photomask to a first fin pattern on a first photomask, the first fin pattern having first and second distal ends, the second fin pattern having first and second distal ends; forming a fin of a first finFET in the semiconductor layer, the fin of the first finFET defined by the first fin pattern, and forming a fin of a second finFET in the semiconductor layer, the fin of the second finFET defined by the second fin pattern.

A second aspect of the present invention is a structure, comprising: a substrate having an insulating layer formed on a top surface of a bulk substrate; a single-crystal semiconductor first fin on a top surface of the insulating layer, the first fin having first and second distal ends; a single-crystal semiconductor second fin on the top surface of the insulating layer, the second fin having first and second distal ends; a single-crystal silicon block between the second end of the first fin and the first end of the second fin, the block integral with the first and the second fin and having a same crystal structure as the first fin; a crystal plane of the first fin about perpendicular to a top surface of the first fin; a longitudinal axis of the first fin and a longitudinal axis of the second fin aligned about parallel to the crystal plane and to the top surface of the first fin; and the longitudinal axis of the first fin and the longitudinal axis of the second fin offset in a direction about perpendicular to the crystal plane.

A third aspect of the present invention is a structure, comprising: a substrate having an insulating layer formed on a top surface of a bulk substrate; a single-crystal silicon first fin on a top surface of the insulating layer, the first fin having first and second distal ends, a top surface of the first fin coplanar with a (100) plane of a crystal structure of the first fin, a longitudinal axis of the first fin about parallel to a {100} plane of the crystal structure of the first fin; a single-crystal silicon second fin on a top surface of the insulating layer, the second fin having first and second distal ends, a top surface of the second fin coplanar with a (100) plane of a crystal structure of the second fin, a longitudinal axis of the first fin about parallel to a {100} plane of the crystal structure of the second fin; a first single-crystal silicon block between the second end of the first fin and the first end of the second fin, the first block integral with the first and the second fin and having the same crystal structure; a single-crystal silicon third fin on a top surface of the insulating layer, the third fin having first and second distal ends, a top surface of the third fin coplanar with a (110) plane of a crystal structure of the third fin, a longitudinal axis of the first fin about parallel to a {110} plane of the crystal structure of the third fin; a single-crystal silicon fourth fin on a top surface of the insulating layer, the fourth fin having first and second distal ends, a top surface of the fourth fin coplanar with a (110) plane of a crystal structure of the fourth fin, a longitudinal axis of the fourth fin about parallel to a {110} plane of the crystal structure of the fourth fin, the second distal end of the third fin abutting the first distal end of the fourth fin, the fourth fin integral with the third fin; a second single-crystal silicon block between the second end of the fourth fin and the first end of the third fin, the second block integral with the third and the fourth fin and having the same crystal structure; the longitudinal axis of the first fin and the longitudinal axis of the second fin offset in a direction about perpendicular to a common {100} plane; the longitudinal axis of the third fin and the longitudinal axis of the fourth fin offset in a direction about perpendicular to a common {110} plane; and the first, second, third and fourth fins having a same crystal structure.

A fourth aspect of the present invention is a method, comprising: providing a substrate having one or more layers; forming a first image and first alignment target images in a first photoresist layer on an uppermost layer of the one or more layers; forming a second image and second alignment target images in a second photoresist layer on the uppermost layer of the one or more layers; transferring the first image and the first alignment target images to one or more of the one or more layers thereby forming first features and first alignment targets in at least one of the one or more layers; transferring the second image and the second alignment target images to one or more of the one or more layers thereby forming second features and second alignment targets in at least one of the one or more layers; removing the first and second photoresist layers; forming a third photoresist layer on an additional layer formed on the uppermost layer or an uppermost remaining layer of the one or more layers; aligning an alignment mark of a photomask to the first and second alignment targets simultaneously, the photomask including a third and a fourth image; and transferring the third and fourth images to the additional layer thereby forming third and fourth features in the additional layer.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIGS. 2A, 2B, 3A, 3B, 4A, 4B, 4C, 5A, 5B, 6A, 6B, 7A, 7B, 8A, 8B, 9A, 9B, 9C, 10A, 10B, 10C, 11A, 11B, 11C are top and corresponding side views illustrating fabrication of a chevron finFET according to a first embodiment of present invention;

FIGS. 12A, 12B, 13A, 13B, 14A, 14B, 15A, 15B, 15C, 16A, 16B, 16C, 17A, 17B and 17C are top and corresponding side views illustrating fabrication of a chevron finFET according to a second embodiment of present invention;

DETAILED DESCRIPTION OF THE INVENTION

In crystalline solids, the atoms, which make up the solid, are spatially arranged in a periodic fashion called a lattice. A crystal lattice contains a volume, which is representative of the entire lattice and is regularly repeated throughout the crystal. In describing crystalline semiconductor materials in the present disclosure, the following conventions are used.

The directions in a lattice are expressed as a set of three integers with the same relationship as the components of a vector in that direction. For example, in cubic lattices, such as silicon, that has a diamond crystal lattice, a body diagonal exists along the [111] direction with the [ ] brackets denoting a specific direction. Many directions in a crystal lattice are equivalent by a symmetry transformation, depending upon the arbitrary choice of orientation axes. For example, a crystal directions in the cubic lattice [100], [010] and [001] are all crystallographically equivalent. A direction and all its equivalent directions are denoted by < > brackets. Thus, the designation of the <100> direction includes the equivalent [100], [010] and [001] positive directions as well as the equivalent negative directions [−100], [0−10] and [00−1].

Planes in a crystal may also be identified with a set of three integers. They are used to define a set of about parallel planes and each set of integers enclosed in ( ) parentheses identifies a specific plane. For example the proper designation for a plane about perpendicular to the [100] direction is (100). Thus, if either a direction or a plane of a cubic lattice is known, its about perpendicular counterpart may be quickly determined without calculation. Many planes in a crystal lattice are equivalent by a symmetry transformation, depending upon the arbitrary choice of orientation axes. For example, the (100), (010) and (001) planes are all crystallographically equivalent. A plane and all its equivalent planes are denoted by { } parentheses. Thus, the designation of the {100} plane includes the equivalent (100), (010) and (001) positive planes as well as the equivalent planes (−100), (0−10) and (00−1). The {100} and {110} planes are orientated to each other at an angle of 45° when formed by vertical surfaces cut from a {100}-surfaced substrate.

The present invention will be described in terms of a silicon on insulator (SOI) substrate and the crystal directions and planes described apply to single-crystal silicon. When the present invention is applied to other than silicon-on-insulator substrates where the semiconductor layer on the insulation is single-crystal Ge, GaP, InAs, InP, SiGe, GaAs, or another group III/V compound, the corresponding crystal directions and planes particular to the other semiconductor material should be substituted for the crystal planes and directions hereinafter referenced.

Figure 1A:
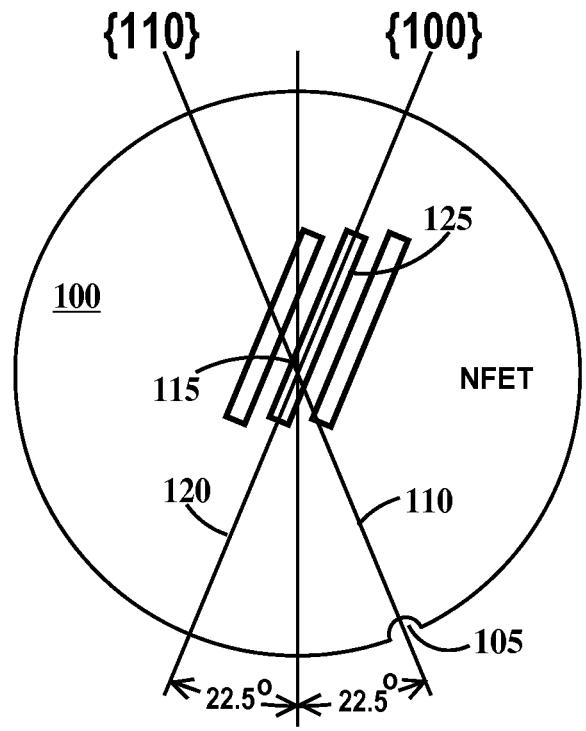
FIGS. 1A and 1B are diagrams illustrating the orientation of fins for NfinFETs and PfinFETs relative to crystal planes of a silicon substrate according to the present invention.
Figure 1B:
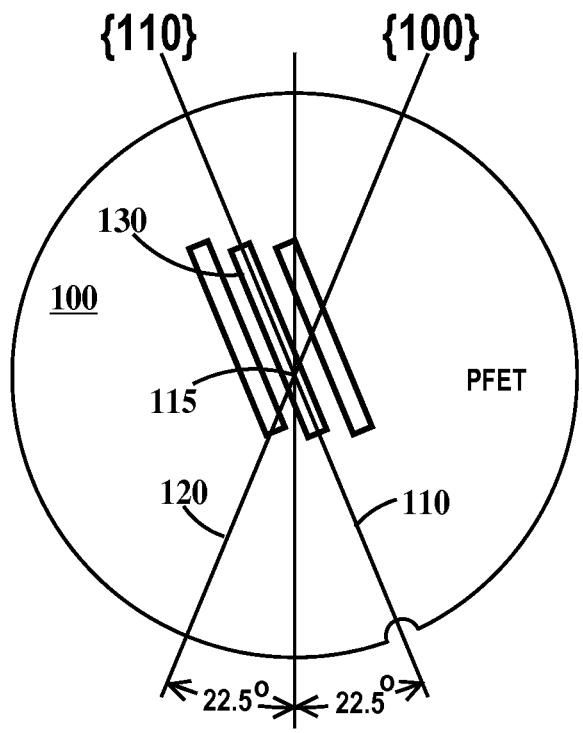

FIGS. 1A and 1B are diagrams illustrating the orientation of fins for NfinFETs and PfinFETs relative to crystal planes of a silicon substrate 100 according to the present invention. In FIGS. 1A and 1B, a circular {100}-surfaced silicon substrate 100 includes an orientation notch 105 (alternatively a flat may be used). An axis 110 running through notch 105 and the geometric center 115 of silicon substrate 100 defines a {110} crystal plane. An axis 120, running through center 115 at an angle of 45° (22.5°+22.5°) defines a {100} plane. In FIG. 1A, a fin body 125 of an NfinFET is aligned about along a {100} axis and inversion carrier (electron) mobility in directions about parallel to axis 120 are nearly maximized relative to any other direction. In FIG. 1B, a fin body 130 of a PfinFET is aligned about along a {110} axis and inversion carrier (holes) mobility in directions about parallel to axis 110 are nearly maximized relative to any other direction.

The present invention will be described in terms of fabricating an NfinFET, however it should be understood that changing the alignments of the various fin fabrication elements from about {100} to about {110} alignment, the descriptions infra, are applicable to fabrication of a PfinFET. FIGS. 2A, 2B, 2C, 3A, 3B, 3C, 4A, 4B, 4C, 5A, 5B, 6A, 6B, 7A, 7B, 8A, 8B, 9A, 9B, 9C, 10A, 10B, 10C, 11A, 11B, 11C and 11D are top and corresponding side views illustrating fabrication of a chevron finFET according to a first embodiment of present invention.

In FIG. 2A, direction 120 is defined by a {100} plane of silicon substrate 100. A first orthogonal direction 135 is defined as offset by an angle A from direction 120 and a second orthogonal direction 140 is defined as offset by an angle B from direction 120. In the example of silicon, A=22.5° and B=67.5°, making the angle between the first and second orthogonal directions 135 and 140 equal to 90°. Directions 120, 135 and 140 are all about parallel to a top surface 145 (see FIG. 2B) of silicon substrate 100. A first set of photoresist features 150 on silicon substrate 100 includes photoresist features 155A, 155B and 155C, each photoresist feature 155A, 155B and 155C having a respective longitudinal axis 160A, 160B and 160C aligned about parallel to direction 120 and each photoresist feature 155A, 155B and 155C offset from one another along direction 140. A second set of photoresist features 165 on silicon substrate 100 includes photoresist features 170A, 170B and 170C, each photoresist feature 170A, 170B and 170C having a respective longitudinal axis 175A, 175B and 175C aligned about parallel to direction 120. Each photoresist feature 170A, 170B and 170C is offset from each other along direction 140.

In a first example each photoresist feature 155A, 155B and 155C are identical and identically spaced apart along direction 135 and each photoresist feature 170A, 170B and 170C are identical and identically spaced apart along direction 135. In a second example each photoresist feature 155A, 155B and 155C each photoresist feature 170A, 170B and 170C are identical and identically spaced apart along direction 135. In a third example, each photoresist feature 170A, 170B and 170C, if shifted only along direction 140 would at some point along direction 140 perfectly align over each respective photoresist feature 155A, 155B and 155C. It should be understood that there may more or less than three photoresist features in each set of photoresist features and the number of photoresist features in each set of photoresist features need not be the same number.

FIG. 2B is a cross-section through line 2B-2B of FIG. 2A. In FIG. 2B, silicon substrate 100 includes a supporting substrate 180, a single crystal silicon layer 185 and an electrically insulating layer, in one example, comprising a buried oxide layer (BOX) 190 layer formed between and completely separating supporting substrate 180 from silicon layer 185. Supporting substrate 180 may independently comprise any appropriate semiconductor material, including, but not limited to: Si, Ge, GaP, InAs, InP, SiGe, GaAs, or other group III/V compounds. A layer of Ge, GaP, InAs, InP, SiGe, GaAs, or other group III/V compounds may be substituted for silicon layer 185. A hard mask layer 195 is formed on top surface 145 of silicon substrate 100 (which is also the top surface of silicon layer 185). Hard mask layer 195 may comprise one or more layers. In one example, hard mask layer 195 comprises a layer of silicon nitride formed over a layer of silicon dioxide. A mandrel layer 200 is formed on top surface 205 of hard mask layer 195. Photoresist features 155A, 155B and 155C are formed on atop surface 210 of mandrel layer 200. Mandrel layer 200 may comprise two layers, an upper layer acting as a hard mask layer for etching a lower layer. In one example, mandrel layer 200 comprises polysilicon. In one example mandrel layer comprises a layer of silicon dioxide over a layer of polysilicon.

There are two alternative methods of forming photoresist features 155A, 155B, 155C, 170A, 170B and 170C of FIG. 2A. In a first method of forming photoresist features, the photoresist features are formed in a layer of photoresist by exposing the photoresist layer to actinic radiation through a first patterned mask and developing the photoresist layer. Additional photoresist features (as illustrated in FIGS. 3A and 3B and described infra) are formed in a different photoresist layer using a second patterned photoresist mask as described infra. In the first method photoresist features 155A, 155B, 155C (and 170A, 170B, 170C of FIG. 2A) are physical photoresist features. In the first method the first patterned mask is a correct positive of the mandrel to be formed and the photoresist is a positive photoresist.

In a second method of forming photoresist features, the developing step is postponed under after additional photoresist features (as illustrated in FIGS. 3A and 3B and described infra) are formed in the same photoresist layer using a second patterned photoresist mask as described infra. In the second method photoresist features 155A, 155B, 155C (and 170A, 170B, 170C of FIG. 2A) are only latent images of a photoresist feature in a photoresist layer 215 denoted by the dashed lines. In the second method the first and second patterned masks is a correct negative of the mandrel to be formed and the photoresist is a negative photoresist.

A correct positive mask has an opaque to (blocks) actinic radiation image of the feature to be formed and a correct negative mask has a clear to (passes) actinic radiation image of the feature to be formed. A positive photoresist, after developing, leaves physical photoresist features wherever the photoresist layer was not exposed to actinic radiation. A negative photoresist, after developing, leaves physical photoresist features wherever the photoresist layer was exposed to actinic radiation.

FIG. 2C, illustrates images of a first portion of an alignment target 220 to be formed according to the present invention. At this point, alignment target 220 comprises a multiplicity of horizontal bars 225 about parallel to direction 135 of FIG. 2A and vertical bars 230 about perpendicular to direction 135 of FIG. 2A. that were printed by the first mask In FIG. 3A, third set of photoresist features 235 on silicon substrate 100 includes photoresist features 240A, 240B and 240C, each photoresist feature 240A, 240B and 240C having a respective longitudinal axis 245A, 245B and 245C aligned about parallel to direction 120 and each photoresist feature 245A, 245B and 245C offset from one another along direction 140. Each photoresist features 240A, 240B and 240C is disposed between a corresponding photoresist feature 155A, 155B and 155C and a corresponding photoresist feature 170A, 170B and 170C. However photoresist features photoresist features 240A, 240B and 240C are shifted in along direction 135 such that photoresist feature 245A overlaps photoresist feature 155B, photoresist feature 240B overlaps both photoresist feature 155B and photoresist feature 170A and photoresist feature 240C overlaps photoresist feature 270B.

In a first example each photoresist feature 240A, 240B and 240C are identical and identically spaced apart along direction 135. In a second example each photoresist feature 240A, 240B and 240C, each photoresist feature 155A, 155B and 155C, and each photoresist feature 170A, 170B and 170C are identical and identically spaced apart along direction 135. In a third example, each photoresist feature 240A, 240B and 240C, if shifted only along direction 140 would at some point along direction 140 perfectly align over each respective photoresist feature 155A, 155B and 155C.

In the first method of forming photoresist features (two photoresist layers) described supra, photoresist features 155A, 155B, 155C, 170A, 170B and 170C are physical photoresist features formed from a first photoresist layer and photoresist features 240A, 240B and 240C are physical photoresist features formed from a second photoresist layer. Thus, photoresist feature 155B is a physical photoresist feature overlapping physical photoresist feature 240A, photoresist feature 240B is a physical photoresist feature overlapping physical photoresist features 155C and 170A, and photoresist feature 240C is a physical photoresist feature overlapping physical photoresist feature.

In the second method of forming photoresist features (one photoresist resist layer) described supra, a development process is performed after latent images of photoresist features 240A, 240B and 240C have been formed in the same photoresist layer in which latent images of photoresist features 155A, 155B, 155C, 170A, 170B and 170C were formed. Thus photoresist feature 155A is a first physical photoresist feature, photoresist features 155B and 240A are portions a second physical photoresist feature, photoresist features 155C, 240B, and 170A are portions of a third physical photoresist feature, photoresist feature 240C and 170C are portions of a fourth physical photoresist feature, and photoresist feature 170 is a fifth physical photoresist feature.

Essentially, three sets of photoresist images on two different masks have been used to define one image (i. e. photoresist features 155C, 240B and 170A). This is necessary to keep the composite photoresist feature aligned to direction 120 (at an angle of 22.5°). If a single photoresist image were to be printed, proximity and other optical effects would both tend to widen the single image at its center and offset its longitudinal axis from 22.5°. Different finFET devices formed along a fin ultimately defined by this single image would have lower mobility and an increased density of surface states, which would degrade circuit performance. In one example, with a single photoresist feature having a width of about 10 nm, the longitudinal axis of the photoresist feature was found to be offset from 22.5° by 4.5° (i.e., was at 18°), which is about a 20% error in alignment of the longitudinal axis of the single photoresist feature.

FIG. 3B is a cross-section through line 3B-3B of FIG. 3A and is identical to FIG. 2B. In FIG. 3C, at this point, alignment target 220 comprises a multiplicity of horizontal bars 225 interdigitated with a multiplicity of horizontal bars 250 and a multiplicity of vertical bars 230 printed interdigitated with a multiplicity of vertical bars 255. Horizontal bars 250 and vertical bars 255 were printed by the second patterned mask. Horizontal bars 250 are aligned about parallel to direction 135 of FIG. 3A and vertical bars 255 are aligned about perpendicular to direction 135 of FIG. 3A.

Figure 4A:
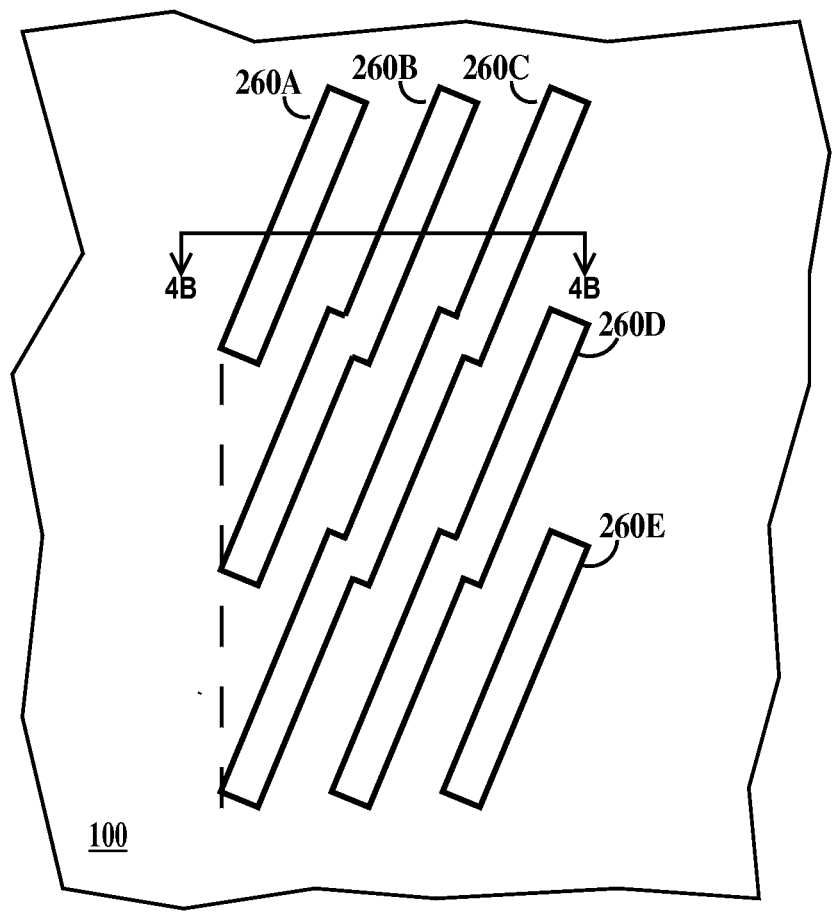
Figure 4B:
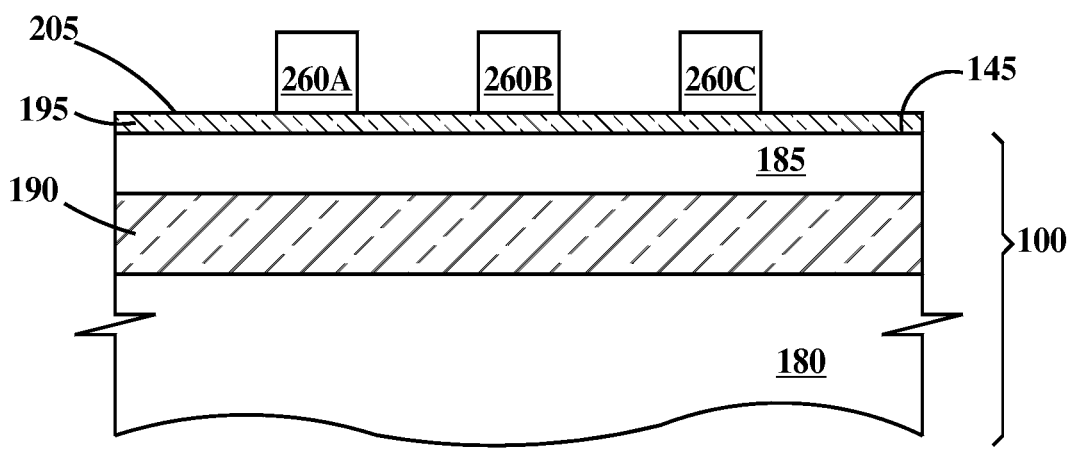

In FIG. 4A, mandrel layer 200 (see FIG. 3B) is etched using photoresist features 155A, 155B, 155C, 170A, 170B, 170C, 240A, 240B and 240C (see FIG. 3A) as a mask to form mandrels 260A, 260B, 260C, 260D and 260E after which the photoresist features are removed. Alternatively, when mandrel layer 200 (see FIG. 3B) comprises and upper and lower layer, photoresist features 155A, 155B, 155C, 170A, 170B, 170C, 240A, 240B and 240C as a mask to form features in the upper layer, the photoresist features are removed and the lower layer etched to form mandrels 260A, 260B, 260C, 260D and 260E. The features in the upper layer may or may not be removed. In one example, mandrels 260A, 260B, 260C, 260D and 260E are formed by reactive ion etch (RIE).

Although, not shown in succeeding figures, alignment target 220 (see FIG. 3C) will continued to be fabricated as finFETs are formed. One of ordinary skill in the art, knowing the finFET fabrication steps hereinafter disclosed would be able to fabricate alignment target 220 concurrent with fabrication of the finFETs.

Figure 5A:
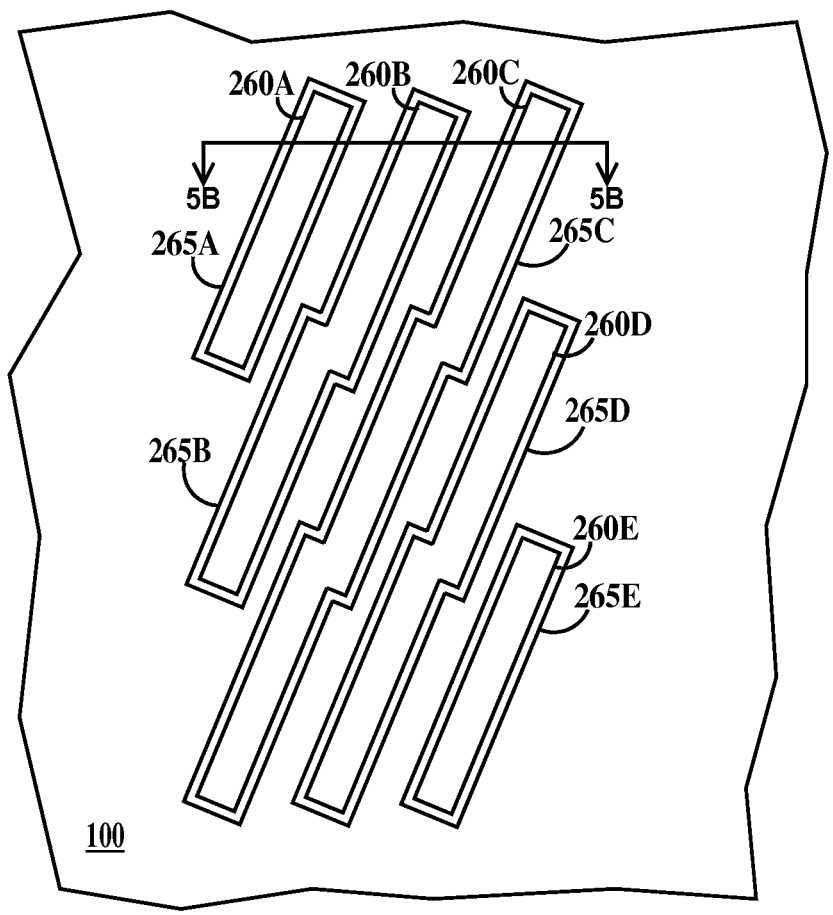
Figure 5B:
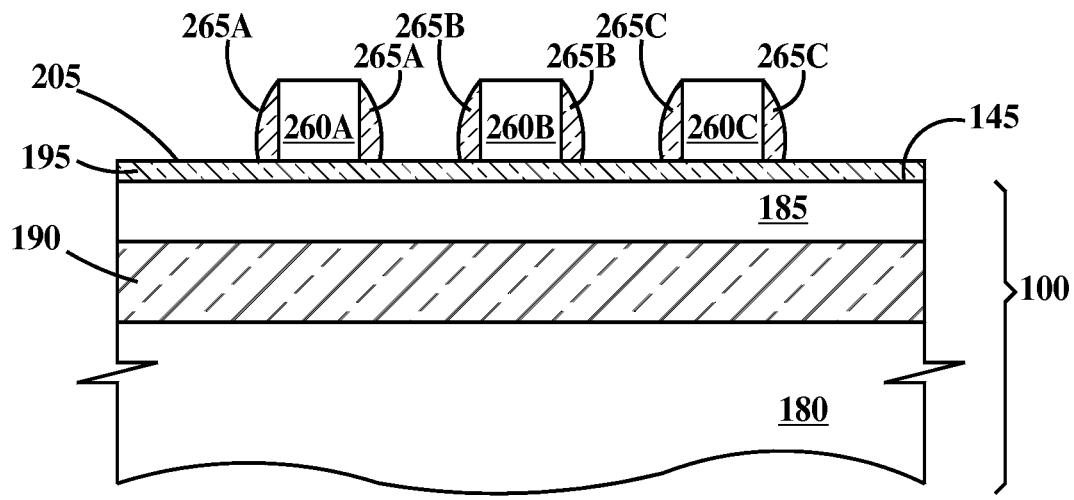

FIG. 5B is a cross-section through line 5B-5B of FIG. 5A. In FIGS. 5A and 5B a spacer 265A is formed on sidewalls of mandrel 260A, a spacer 265B is formed on sidewalls of mandrel 260B, a spacer 265C is formed on sidewalls of mandrel 260C, a spacer 265D is formed on sidewalls of mandrel 260D and a spacer 265E is formed on sidewalls of mandrel 260E. In one example, spacers 265A, 265B, 265C, 265D and 265E comprise silicon dioxide formed by deposition of a conformal layer of silicon dioxide followed by a RIE of the deposited silicon dioxide layer.

Figure 6A:
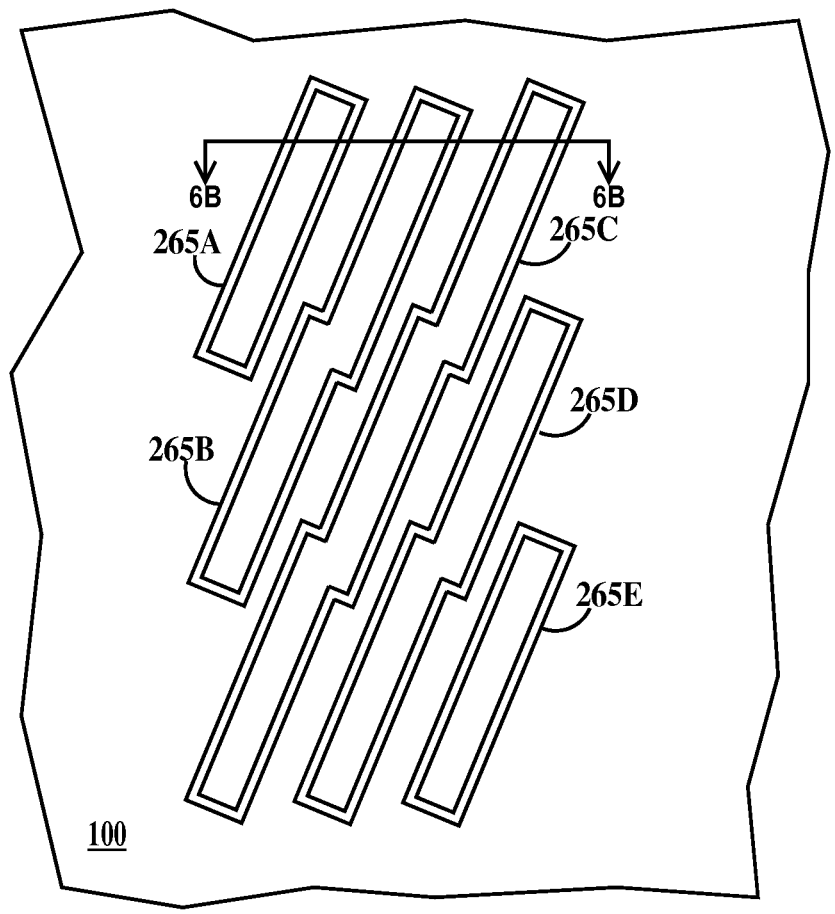
Figure 6B:
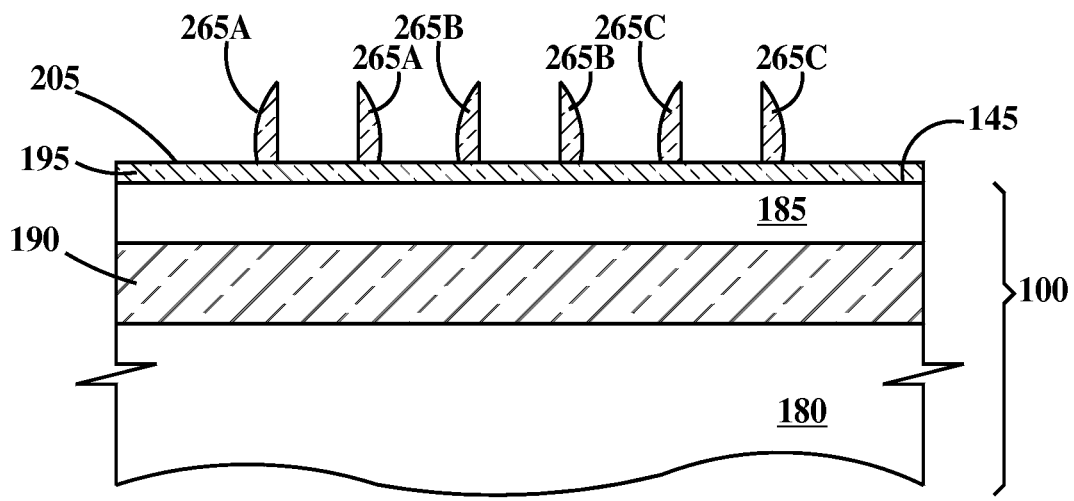

FIG. 6B is a cross-section through line 6B-6B of FIG. 6A. In FIGS. 6A and 6B a mandrels 260A, 260B, 260C, 260D and 260E are removed, in one example by a wet etch.

Figure 7A:
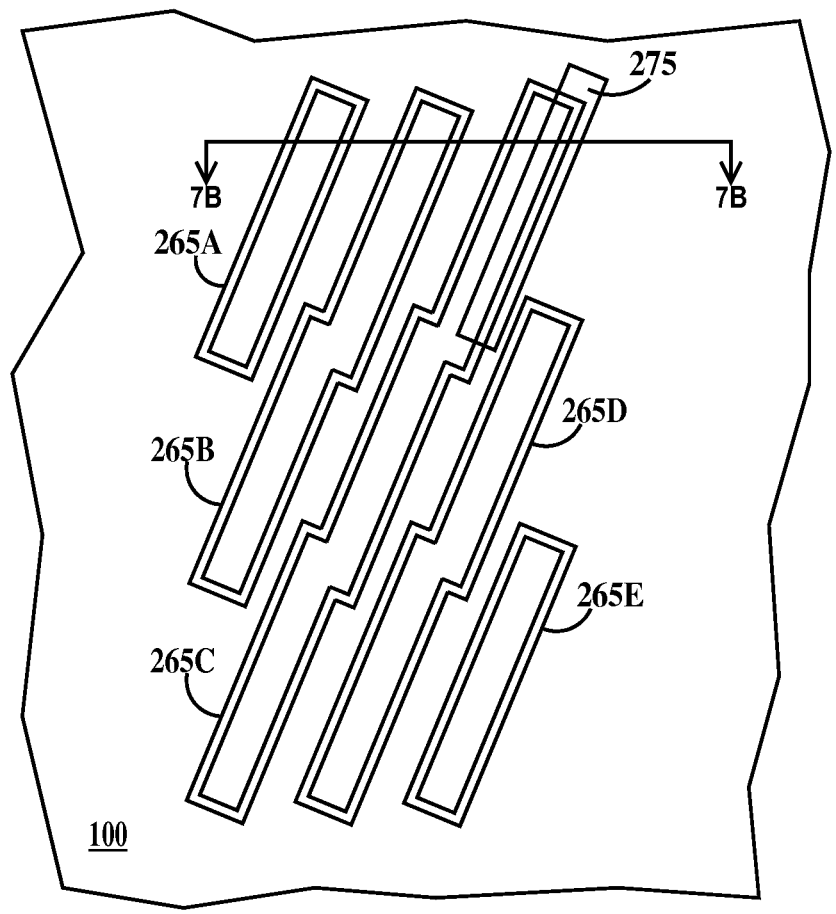
Figure 7B:
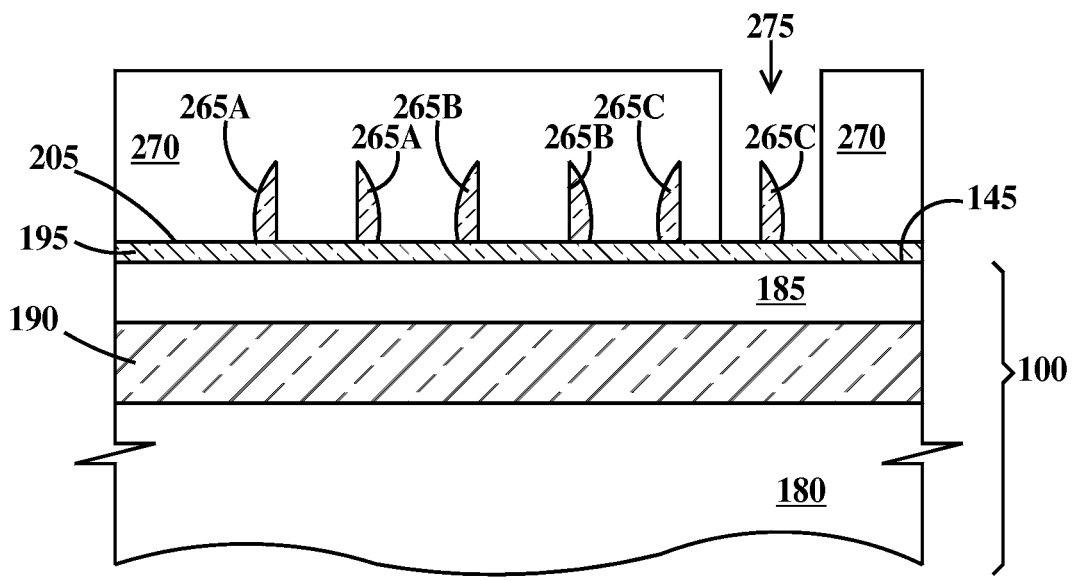
Figure 8A:
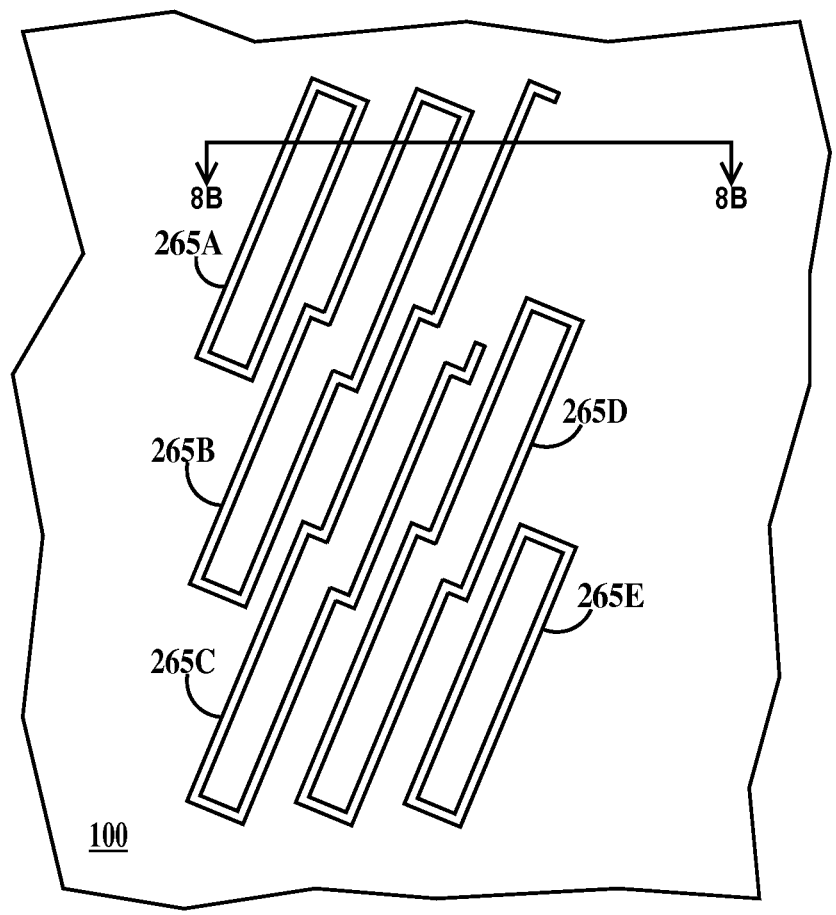
Figure 8B:
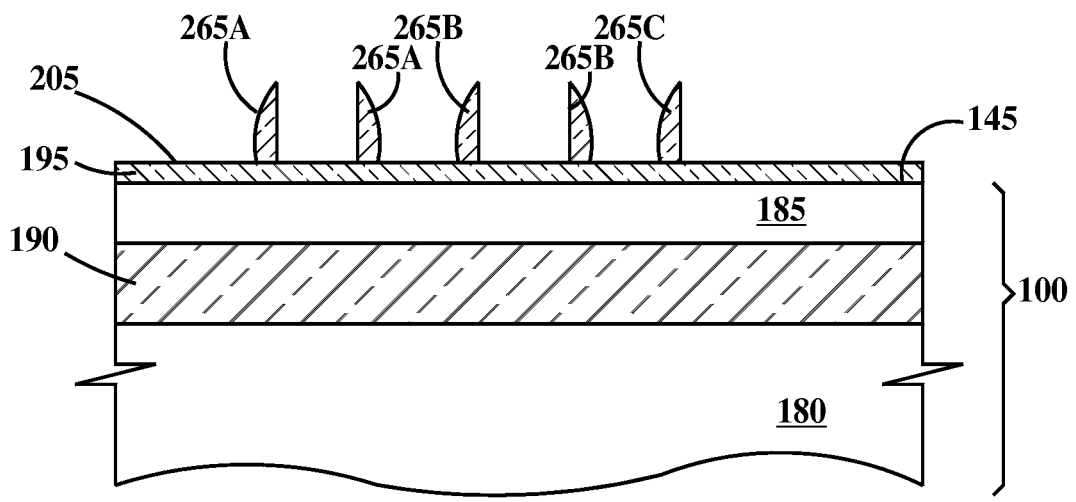

FIGS. 7A, 7B, 8A and 8B illustrate optional steps that will reduce the number of finFET devices in a row of finFET devices (see FIG. 11A). FIG. 7B is a cross-section through line 7B-7B of FIG. 7A. In FIGS. 7A and 7B, a photoresist layer 270 is formed over spacers 265A, 265B, 265C, 265D and 265E and an opening 275 is formed in the photoresist layer over a portion of spacer 265C. FIG. 8B is a cross-section through line 8B-8B of FIG. 8A. In FIGS. 8A and 8B a portion of spacer 265C is removed followed by removal of photoresist layer 270 (see also FIG. 7B).

Figure 10B:
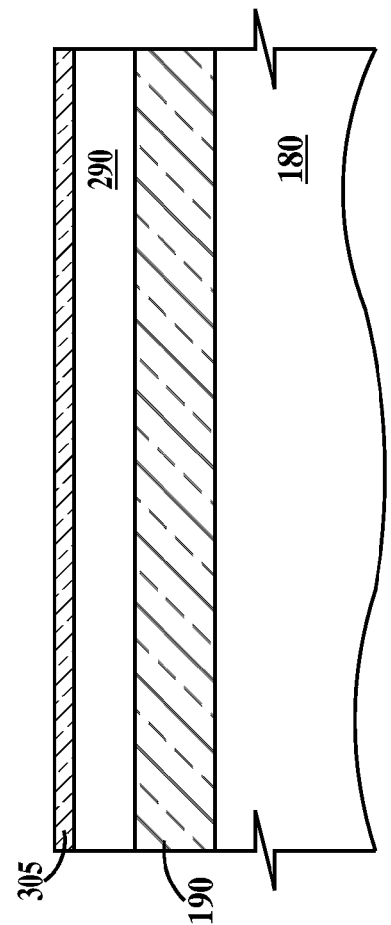
Figure 10C:
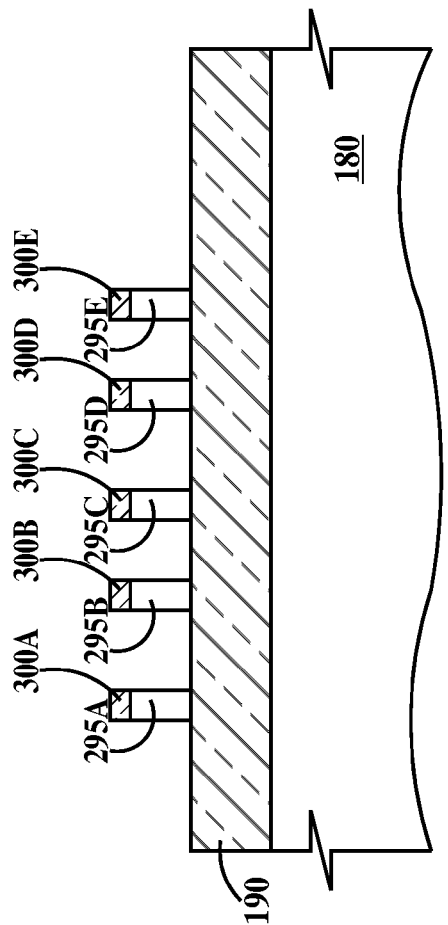
Figure 10A:
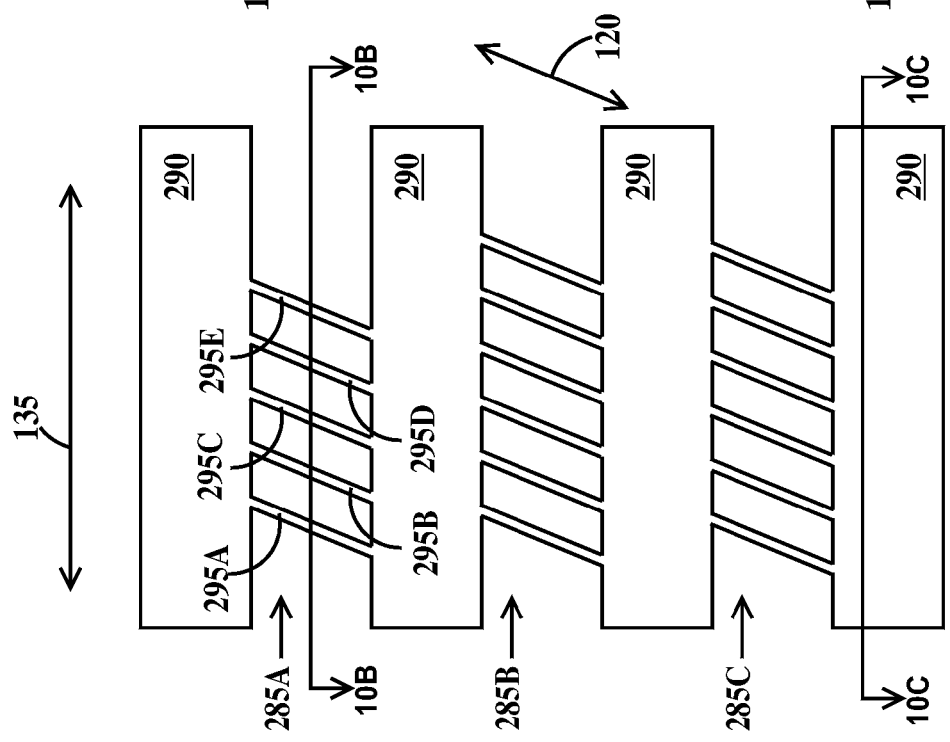

In FIG. 9A, photoresist features 280 are formed over regions of spacers 265A, 265B, 265C, 265D and 265E to cover corners and jogs of spacers 265A, 265B, 265C, 265D and 265E. Photoresist features 280 may be formed by any number of photolithographic techniques known in the art. FIG. 9B is a cross-section through line 9B-9B of FIG. 9A and FIG. 9C is a cross-section through line 9C-9C of FIG. 9A. In FIG. 9B, only spacers 265A, 265B and 265C will define a pattern in hard mask layer 195 and then in semiconductor layer 195 as illustrated in FIGS. 10A, 10B and 10C and described infra. In FIG. 9C, photoresist feature 280 will define a pattern in hard mask layer 195 and silicon layer 185 as illustrated in FIGS. 10A, 10B and 10C and described infra. Spacers 265A, 265B, 265C, 265D and 265E and photoresist features 280 form a composite mask for the etching of hard mask layer 195 and silicon layer 185.

Photoresist features 280 are formed, and avoid subsequent etching (in hard mask layer 195 and silicon layer 185) of sub-minimum features at the jogs that could cause unresolved structures to etch irregularly and subsequently create defects in the array of FinFETs that is being fabricated. These defects could detach from the wafer and subsequently be deposited elsewhere on the wafer, thereby degrading production yield.

In FIG. 10A, the composite mask comprised of spacers 265A, 265B, 265C, 265D and 265E and photoresist features 280 (see FIG. 9A) is transferred to hard mask layer 195 (see FIGS. 9B and 9C), for example, by an RIE), the spacers 265A, 265B, 265C, 265D and 265E and photoresist features 280 (see FIG. 9A) removed and the patterned hard mask layer is used as an etch mask for silicon layer 185 (see FIGS. 9B and 9C). The result of these process steps is sets of fins 285A, 285B and 285C and integral silicon blocks 290. Using set of fins 285A as an example, there are five fins (fins 295A, 295B, 295C, 295D and 295E) in the set of fins 285A. The longitudinal axes of silicon blocks 290 are aligned in direction 135. The longitudinal axis of fins 295A, 295B, 295C, 295D, 295E and all other fins are aligned in direction 120.

FIG. 10B is a cross-section through line 10B-10B of FIG. 10A and FIG. 10C is a cross-section through line 10C-10C of FIG. 10A. In FIG. 10B, fins 295A, 295B, 295C, 295D and 295E have respective dielectric caps 300A, 300B, 300C, 300D and 300E. Dielectric caps 300A, 300B, 300C, 300D and 300E comprise all or some of the layers of hard mask layer 195 (see FIG. 9B) after patterning of the hard mask layer. In FIG. 10C, silicon block 290 has a dielectric cap 305, Dielectric cap 305 comprises all or some of the layers of hard mask layer 195 (see FIG. 9C) after patterning of the hard mask layer. Optionally, dielectric caps 300A, 300B, 300C, 300D, 300E and 305 (and all other dielectric caps on all other fins and silicon blocks 290) may be removed.

FIG. 11B is a cross-section through line 11B-11B of FIG. 11A and FIG. 11C is a cross-section through line 11C-11C of FIG. 11A. In FIG. 11A a gate structure 310A is formed over sets of fins 285A, a gate structure 310B is formed over sets of fins 285B, and a gate structure 310C is formed over sets of fins 285C. In FIG. 11B, it can be seen that gate structure 310A includes a gate dielectric 315, a gate electrode 320 and an optional dielectric cap 325. In one example, gate dielectric 315 is $SiO_2$, a high K (dielectric constant) material, examples of which include but are not limited metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$ or combinations of layers thereof. A high K dielectric material has a relative permittivity above 10. In one example gate electrode 320 is polysilicon.

Gate structure structures 310A, 310B and 310C may be formed by any number of well known photolithographic and etch techniques. In one example, gate structure structures 310A, 310B and 310C are formed by deposition of a gate dielectric layer, a conductive gate layer and a dielectric capping layer followed by formation and patterning of a photoresist layer, etching the pattern of the patterned photoresist layer into the capping layer, removing the resist, and transferring the pattern in the capping layer into the conductive gate layer. Dielectric capping layer 325 may or may not be removed.

In FIG. 11D, alignment marks from the mask used to define the gate mask are illustrated aligned over alignment target 220. For clarity, horizontal first fin mask bars 225 are shown misaligned to horizontal second fin mask bars 250, vertical first fin mask bars 230 are shown misaligned to from vertical second fin mask bars 235. Gate alignment mark horizontal bars 330 (aligned about parallel to direction 135 of FIG. 11A) are interdigitated with horizontal first fin mask bars 225 and horizontal second fin mask bars 250. Gate alignment mark vertical bars 335 (aligned about perpendicular to direction 135 of FIG. 11A) are interdigitated with vertical first fin mask bars 230 and vertical second fin mask bars 235.

To complete a finFET, halo and extension ion implantations are performed, a spacer formed on the sidewalls of the gate, a source/drain ion implantations performed, contacts to the gate and source/drains formed. The contacts may comprise silicide, metal stud, or silicide and metal stud contacts. A more detailed description of how alignment targets and alignment marks according to the present invention are utilized is discussed infra with reference to FIGS. 20 and 21.

FIGS. 12A, 12B, 13A, 13B, 14A, 14B, 15A, 15B, 15C, 16A, 16B, 16C, 17A, 17B and 17C are top and corresponding side views illustrating fabrication of a chevron finFET according to a second embodiment of present invention.

Figure 12A:
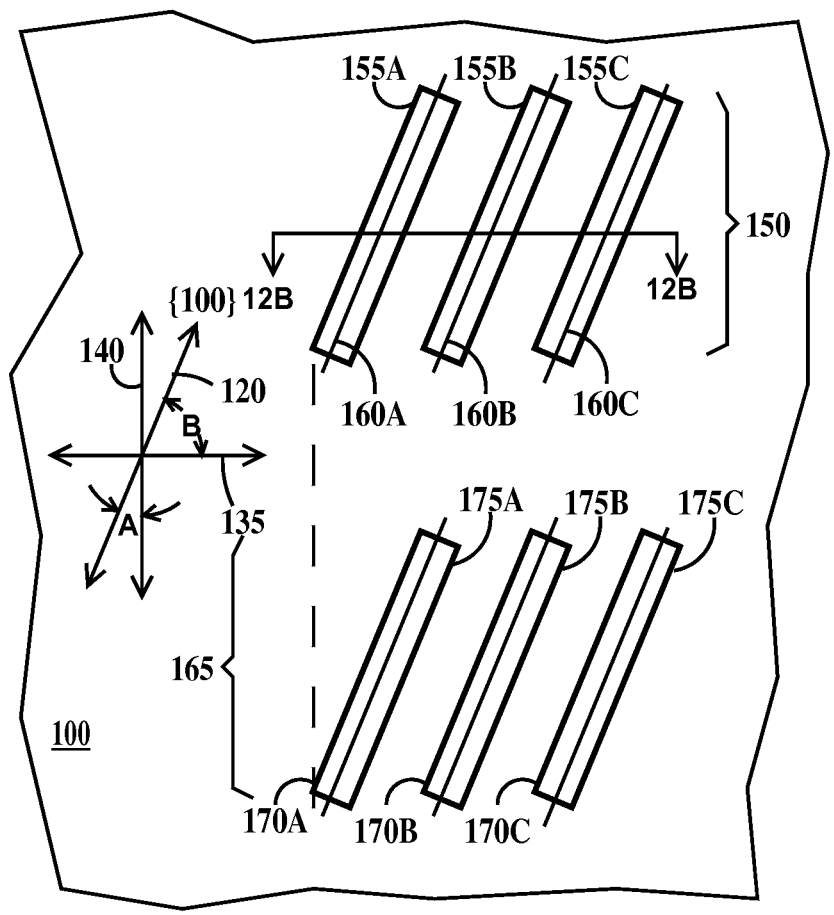
Figure 12B:
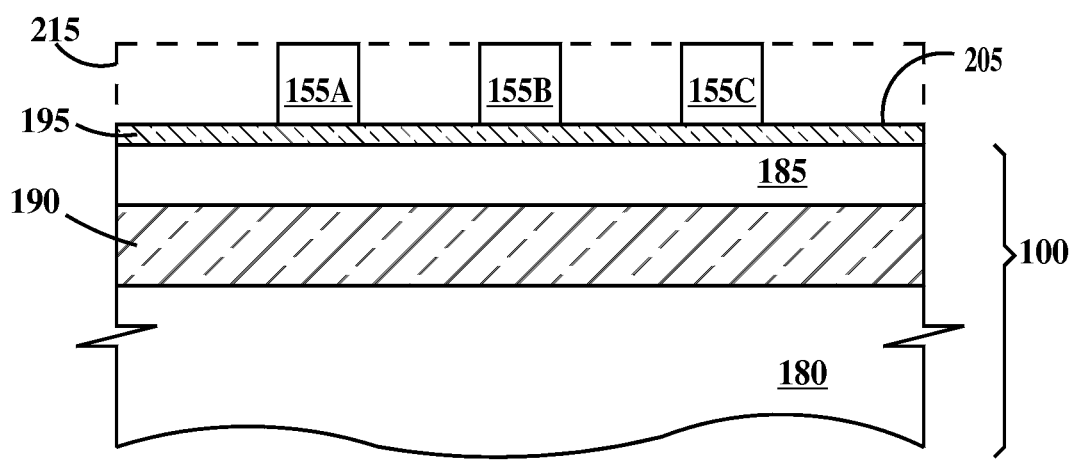

FIG. 12B is a cross-section through line 12B-12B of FIG. 12A. FIGS. 12A and 12B are similar to FIGS. 2A and 2B except mandrel layer 200 (see FIG. 2B) is not present and photoresist features 155A, 155B, 155C, 170A, 170B and 170C are formed on a top surface 205 of hard mask layer 195.

Figure 13A:
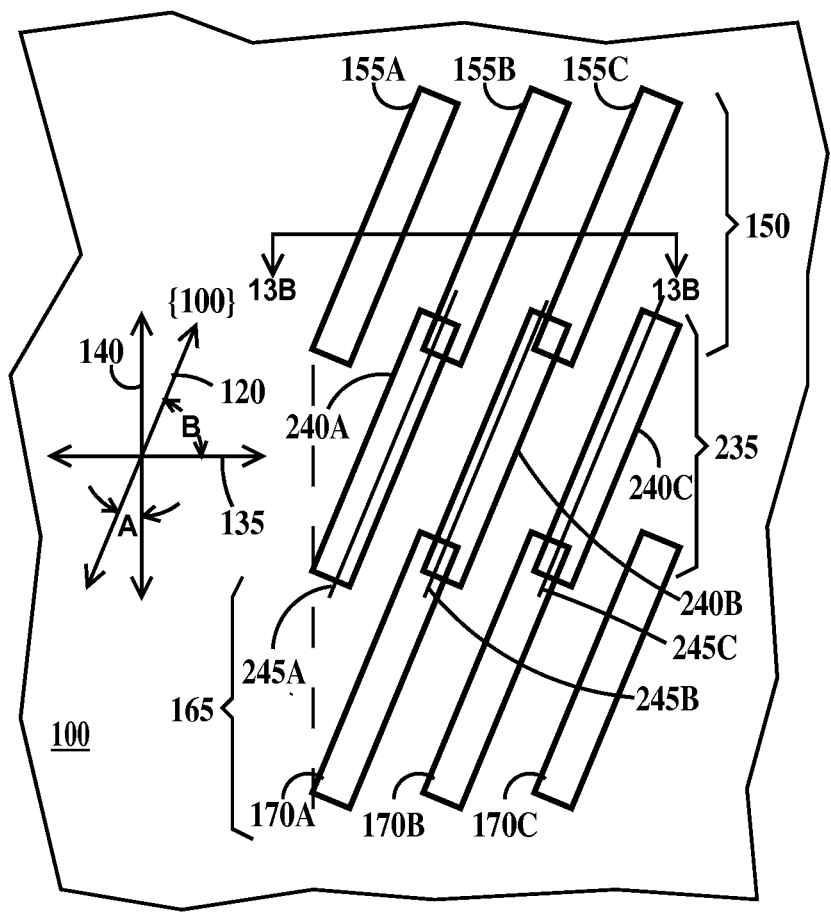
Figure 13B:
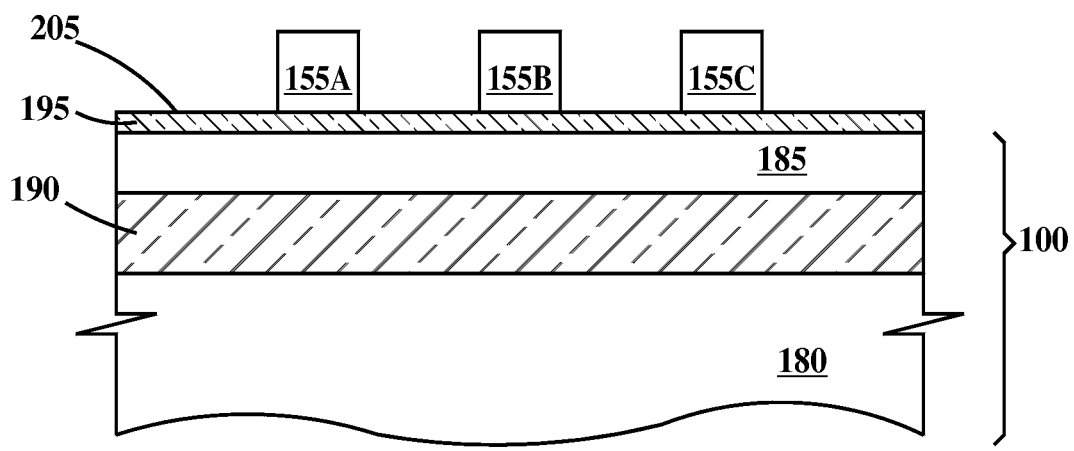

FIG. 13B is a cross-section through line 13B-13B of FIG. 13A. FIGS. 13A and 13B are similar to FIGS. 3A and 3B except mandrel layer 200 (see FIG. 3B) is not present and photoresist features 240A, 240B and 240C are formed on a top surface 205 of hard mask layer 195.

Figure 14A:
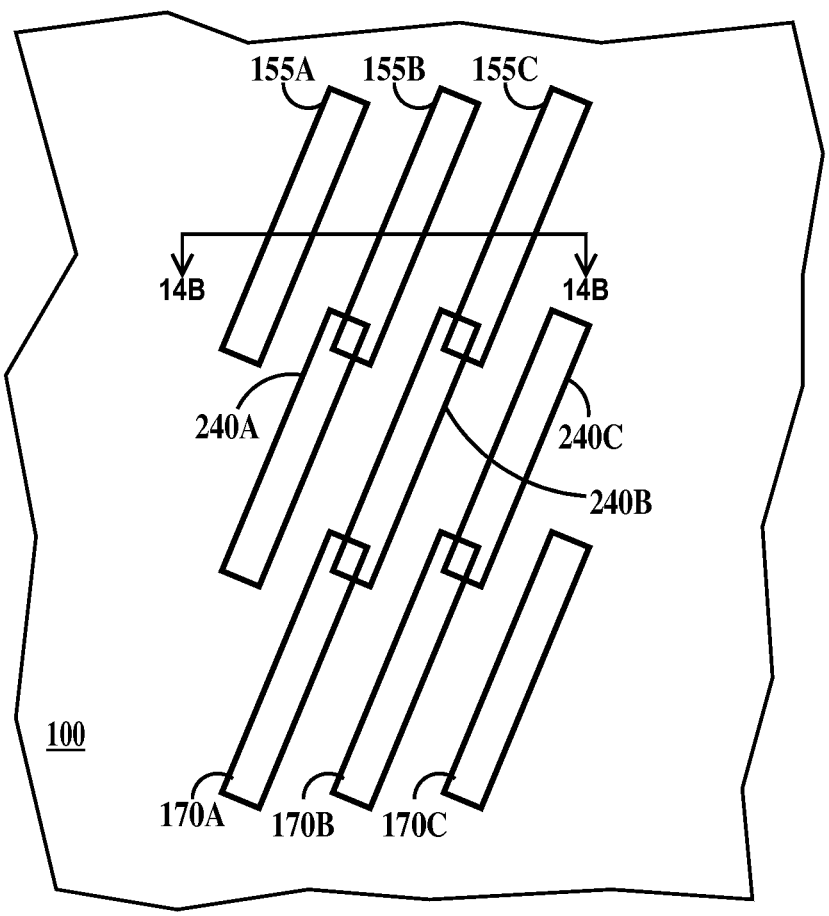
Figure 14B:
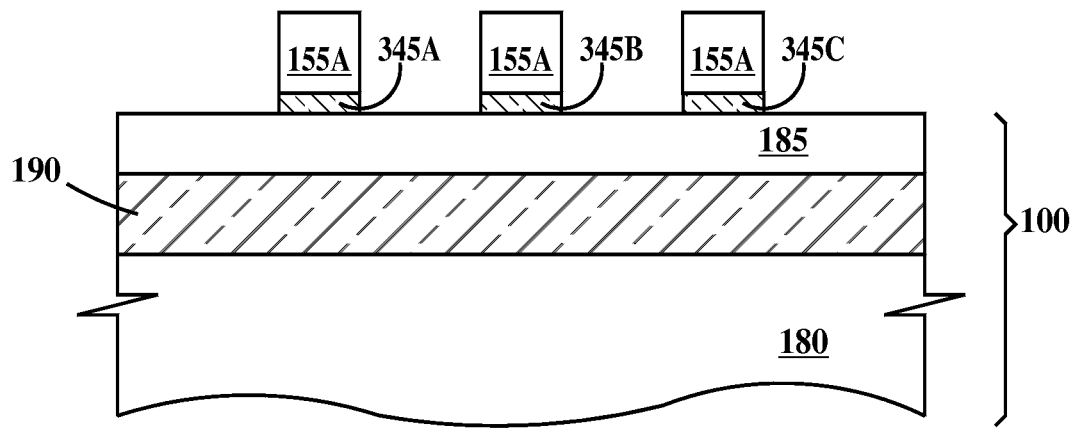

FIG. 14B is a cross-section through line 14B-14B of FIG. 14A. In FIGS. 14A and 14B the pattern formed by photoresist features 155A, 155B, 155C, 170A, 170B, 170C, 240A, 240B and 240C is transferred into hard mask layer 195 (see FIG. 13B) by, for example an RIE. In FIG. 14B, hard mask features 345A, 345B and 345C are shown. Prior to the steps illustrated in FIGS. 15A, 15B and 15C, photoresist features 155A, 155B, 170A, 170B, 170C, 240A, 240B and 240C are removed.

In FIG. 15A, photoresist features 280 are formed over regions of hard mask features 345A, 345B, 345C, 345D and 345E to cover corners and jogs of hard mask features 345A, 345B, 345C, 345D and 345E. FIG. 15B is a cross-section through line 15B-15B of FIG. 15A and FIG. 15C is a cross-section through line 15C-15C of FIG. 15A. In FIG. 15B, only hard mask features 345A, 345B, 345C will define a pattern in silicon layer 185 as illustrated in FIGS. 16A, 16B, and 16C and described infra. In FIG. 15C, photoresist feature 280 will define a pattern in hard mask layer 195 as illustrated in FIGS. 16A, 16B, and 16C and described infra. Hard mask features 345A, 345B, 345C, 345D and 345E and photoresist features 280 form a composite mask for the etching of silicon layer 185.

In FIG. 16A, the composite mask comprised of hard mask features 345A, 345B, 345C, 345D and 345E and photoresist features 280 (see FIG. 15A) is transferred to silicon layer 185 (see FIGS. 15B and 15C), for example, by an RIE and the hard mask features 345A, 345B, 345C, 345D and 345E and photoresist features 280 (see FIG. 15A) are removed. The result of these process steps is fins 350A, 350B and 350C and integral with and between silicon blocks 290A and 290B, fins 355A, 355B and 355C and integral with and between silicon blocks 290B and 290C, and fins 360A, 360B and 360C and integral with and between silicon blocks 290C and 290D. The longitudinal axes of silicon blocks 290A, 290B, 290C and 290D are aligned in direction 135. The longitudinal axis of fins 350A, 350B, 350C, 355A, 355B, 355C, 360A. 360B and 360C are aligned in direction 120.

FIG. 16B is a cross-section through line 16B-16B of FIG. 16A and FIG. 16C is a cross-section through line 16C-16C of FIG. 16A. In FIG. 16B, fins 350A, 350B and 350C have respective dielectric caps 365A, 365B and 365C. Dielectric caps 365A, 365B and 365C comprise all or some of the layers of hard mask layer 195 (see FIG. 13B). In FIG. 16C, on silicon block 290D are dielectric caps 370A, 370B and 370C that extend over fins 360A, 360B and 360C (see FIG. 16A). Dielectric caps 370A, 370B and 370C comprises all or some of the layers of hard mask layer 195 (see FIG. 15C). Optionally, dielectric caps 365A, 3650B, 365C, 370A, 370B and 370C and other dielectric caps on fins 355A, 355B and 355C and silicon blocks 290A, 290B and 290C may be removed.

FIG. 17B is a cross-section through line 17B-17B of FIG. 17A and FIG. 17C is a cross-section through line 17C-17C of FIG. 17A. In FIG. 17A gate structure 310A is formed over fins 350A, 350B and 350C, gate structure 310B is formed over fins 355A, 355B and 355C, and gate structure 310C is formed over fins 360A, 360B and 360C. In FIG. 17B, it can be seen that gate structure 310A includes, gate dielectric 315, gate electrode 320 and optional dielectric cap 325. Dielectric cap 325 may or may not be removed.

Figure 18:
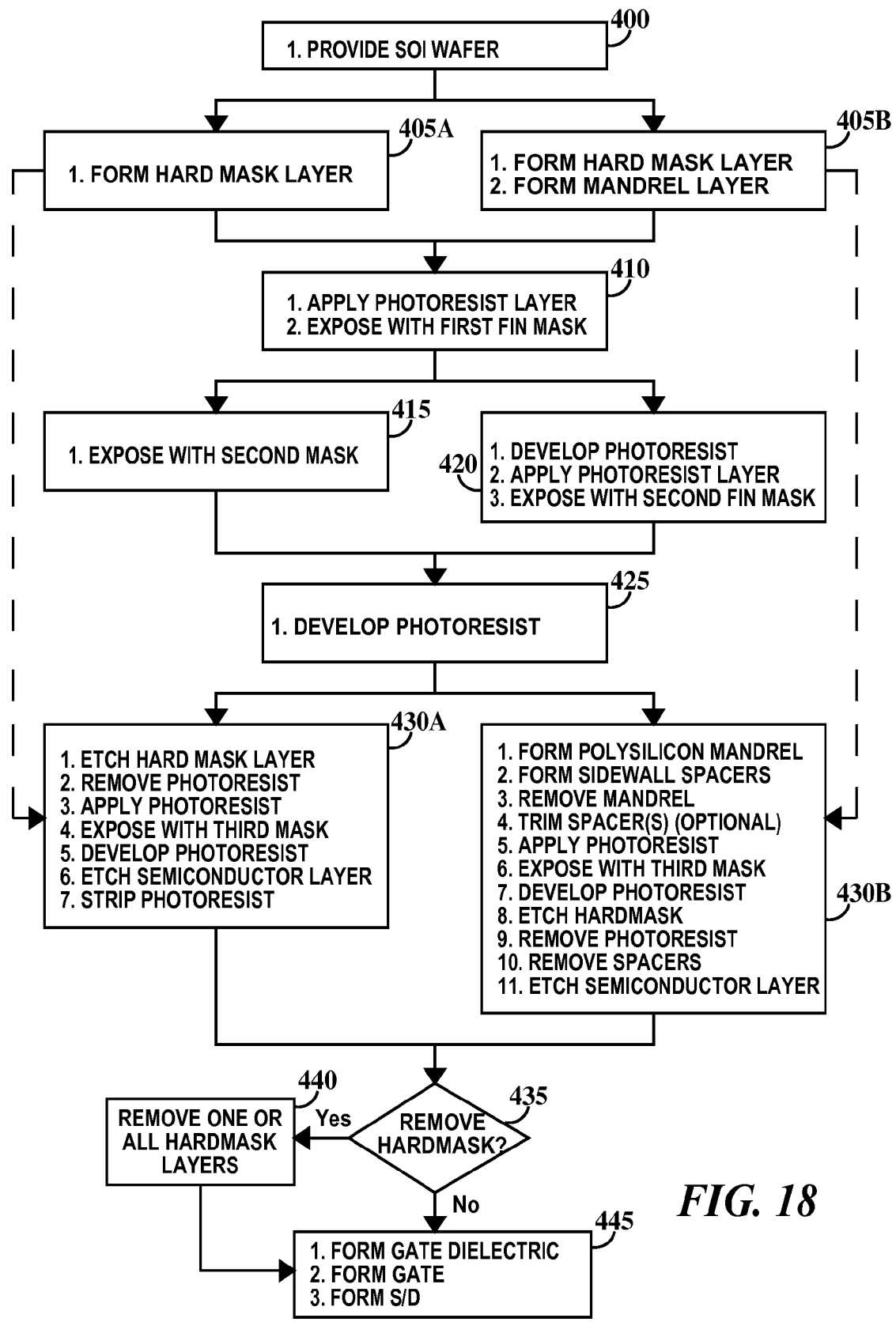
FIG. 18 is a flowchart of the methods of fabricating fin-FETs according to the present invention.

FIG. 18 is a flowchart of the methods of fabricating finFETs according to the present invention. In step 400, an SOI substrate is provide (or a semiconductor on insulator) substrate is provided. The method may then proceed to either step 405A or 405B.

In step 405A, a hard mask layer is formed on the silicon or semiconductor layer. The hard mask layer may comprise one or more individual layers. In step 405B, in addition to forming a hard mask layer as in step 405A, a mandrel layer is formed on top of the hard mask layer. The mandrel layer may include two or more layers. From either step 405A or 405B the method proceeds to step 410.

In step 410, a photoresist layer is applied over either the hard mask layer or the mandrel layer. Also in step 410, the photoresist layer is exposed with a first fin pattern mask to form a first latent fin pattern image. The method may then proceed to either step 415 or 420.

In step 415, the photoresist layer is exposed with a second fin pattern mask to form a second latent fin pattern image in the photoresist layer, the second latent fin pattern image overlapping the first latent fin pattern image. From step 415, the method proceeds to step 425.

In step 420, the photoresist layer exposed in step 400 is developed to convert the first latent fin pattern image into a first fin pattern photoresist feature. Then a second photoresist layer is applied over either the hard mask layer or the mandrel layer (depending on whether step 405A or 405B was previously performed) and the second photoresist layer is exposed with the second fin pattern mask to form a second latent fin pattern image in the photoresist layer, the second latent fin pattern image overlapping the first fin pattern photoresist feature. From step 420, the method proceeds to step 425.

In step 425 a developing step is performed to either convert the first and second latent fin pattern images into first and second fin pattern photoresist features if step 425 was performed after step 415 or to convert second latent fin pattern images into a second fin pattern photoresist feature if step 425 was performed after step 420. The method then proceeds to either step 430A or 430B. The method proceeds to step 430A if step 405A was previously performed. The method proceeds to step 430B if step 405B was previously performed.

In step 430A, fins are formed by a direct imaging process. In step 430A, the pastern of the photoresist features are transferred into the hard mask layer and the photoresist features are removed. Then a photoresist layer is applied and exposed with a third mask to form latent photoresist images over the portions of the hard mask where the second latent fin pattern image overlapped the first latent fin pattern image in step 415 or the second latent fin pattern image overlapped the first fin pattern photoresist feature in step 420. Next the photoresist layer is developed to form a photoresist feature from the latent photoresist feature. The silicon or other semiconductor layer is etched to form fins and the photoresist features removed. The method then proceeds to step 435.

In step 430B, fins are formed by a sidewall image transfer (SIT) process. In step 430B, the photoresist features are used as a mask to form a mandrel in the mandrel layer and the photoresist layer is removed. (It has been described supra, that forming the mandrel could include an image transfer process though a mandrel hard mask layer.) Next, spacers are formed on the sidewall of the mandrel and the mandrel is removed. An optional photolithographic and etch step may be performed to remove regions of the spacers. Then a photoresist layer is applied and exposed with a third mask to form latent photoresist images over the portions of the hard mask where the second latent fin pattern image overlapped the first latent fin pattern image in step 415 or the second latent fin pattern image overlapped the first fin pattern photoresist feature in step 420. Next the photoresist layer is developed to form a photoresist feature from the latent photoresist feature. The hard mask layer is etched using the spacers and the photoresist feature as etch masks. The spacers and the photoresist feature are then removed and the silicon or other semiconductor layer is etched to form fins. The method then proceeds to step 435.

In step 435 it is decided if any or all of the hard mask layer remaining over the silicon or other semiconductor layer is to be removed. If so, then the method proceeds to step 440, otherwise the method proceeds to step 445.

In step 440, one or all of any remaining hard mask layers on the silicon or other semiconductor layer are removed. The method proceeds to step 445.

In step 445, a gate dielectric layer is formed over the fins and a gate electrode layer is formed over the gate dielectric layer. Then a photolithographic and etch process is performed to form gate electrodes over the fins. Next, a source/drain ion implantation is performed to form source and drains in the fins on opposite sides of the gate electrode. The source/drain ion implantation may be preceded by gate sidewall spacer formation and gate sidewall spacer formation may itself be preceded by halo and extension ion implantations as is known in the art.

Figure 19:
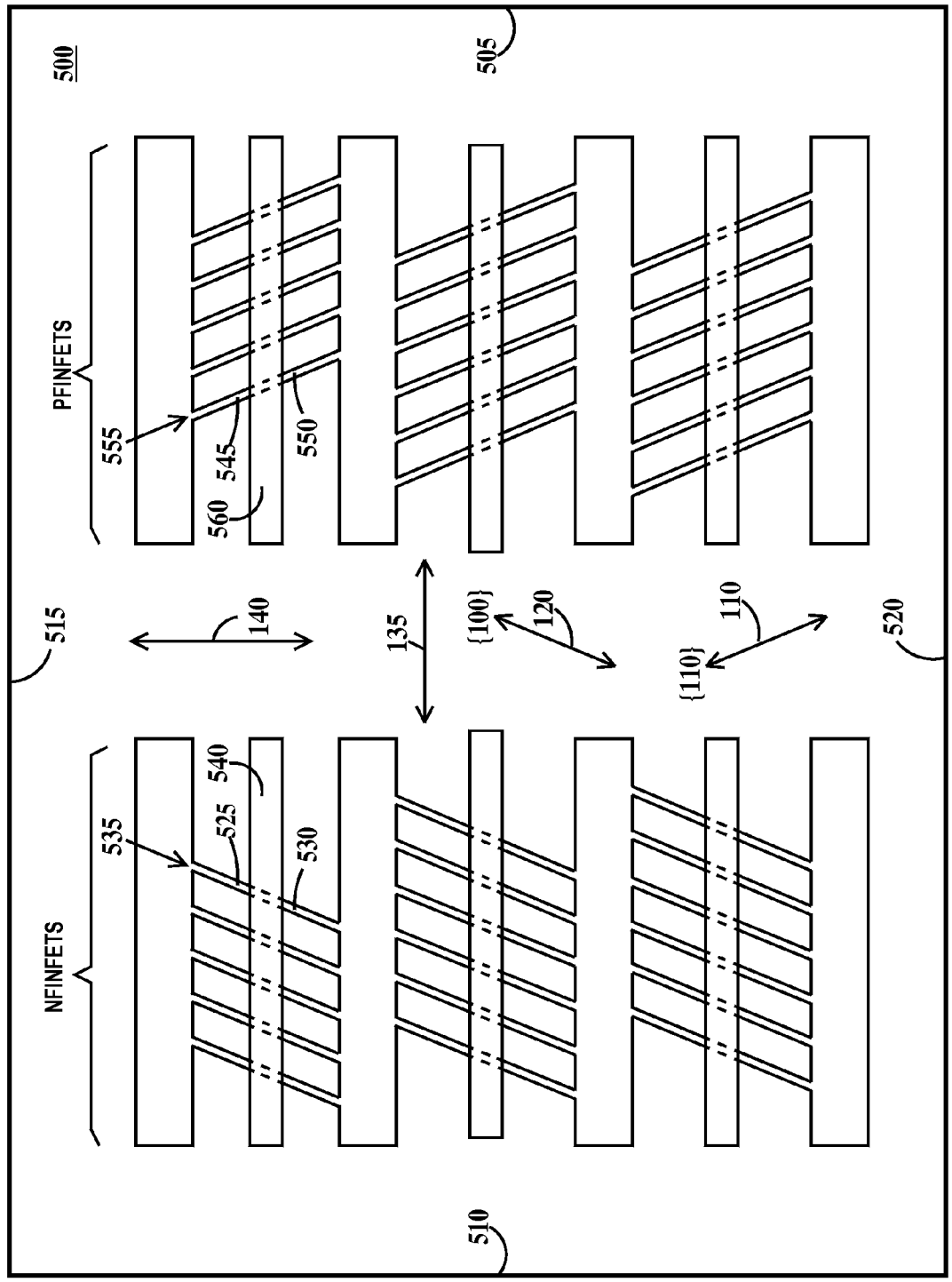
FIG. 19 is a top view of an integrated circuit chip illustrating PfinFETs and NfinFETs according to the present invention suitable for use in chevron finFET circuits.
Figure 20:
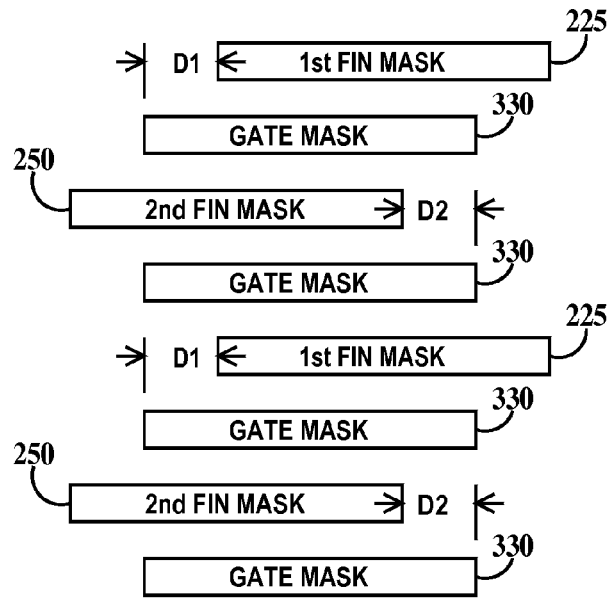
FIGS. 20 and 21 are top views illustrating fin to gate alignment marks according to the present invention.
Figure 21:
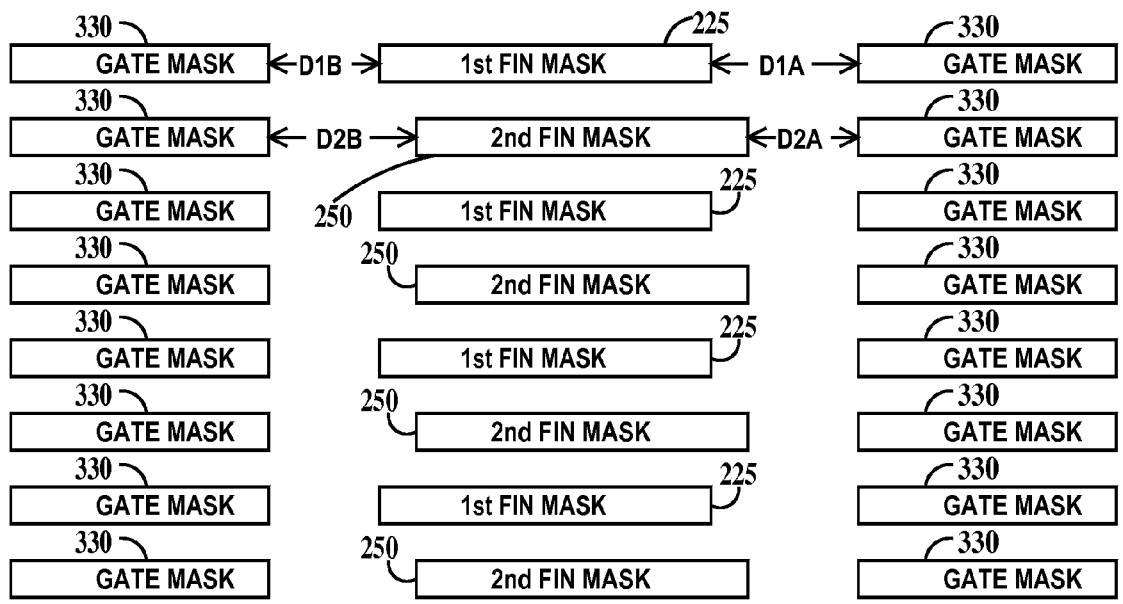

FIG. 19 is a top view of an integrated circuit chip illustrating PfinFETs and NfinFETs according to the present invention suitable for use in chevron finFET circuits. In FIG. 19, an integrated circuit chip includes opposite sides 505 and 510 and opposites sides 515 and 520. Sides 505 and 510 are orthogonal to sides 515 and 520. Sides 505 and 510 are about parallel to direction 140 defined supra, and sides 515 and 520 are aligned about parallel to direction 135 defined supra. Formed in integrated circuit chip 500 are NfinFETs, each having a source/drain region 525 and a source/drain region 530 in a fin body 535 and a gate dielectric (not shown) between a channel region of the fin body and a gate electrode 540, the channel region located in the fin body between the source/drain regions. Gate 530 is aligned about parallel to direction 135 and fin body 535 is aligned about parallel to direction 120 defined supra, which is also a $\{100\}$ crystal plane of the fin body. Also formed in integrated circuit chip 500 are PfinFETs, each having a source/drain region 545 and a source/drain region 550 in a fin body 555 and a gate dielectric (not shown) between a channel region of the fin body and a gate electrode 560, the channel region located in the fin body between the source/drain regions. Gate 560 is aligned about parallel to direction 135 and fin body 555 is aligned about parallel to direction 110 defined supra, which is also a $\{110\}$ crystal plane of the fin body FIGS. 20 and 21 are top views illustrating fin to gate alignment marks according to the present invention. In FIG. 20, gate alignment marks 330 are aligned between first fin mask target marks 225 and second fin mask target marks 250. Gate mask marks 330 are offset from perfect alignment with first fin mask target marks 225 by a distance D1. Gate mask marks 330 are offset from perfect alignment with second fin mask target marks 250 by a distance D2. The alignment between mask target marks 225 and second fin mask target marks 250 is off by the value |D1+D2|. Under perfect alignment between the three masks D1=D2=0. The best possible alignment when D1 and D2 are not equal to zero occurs when D1=D2. Alignment systems of conventional photolithography tools may be adjusted to automatically position the gate mask relative to a substrate having the first and second fin mask targets marks misaligned to one another so that D1=D2.

In FIG. 21, a central column of alternating first fin mask target marks 225 and second fin mask target masks 250 are flanked by first and second columns of gate mask alignment marks 330. Gate mask marks 330 in the first column are offset from perfect alignment with first fin mask target marks 225 by a distance D1A and gate mask marks 330 in the second column are offset from perfect alignment with first fin mask target marks 225 by a distance D1A. Gate mask marks 330 in the first column are offset from perfect alignment with second fin mask target marks 250 by a distance D2A and gate mask marks 330 in the second column are offset from perfect alignment with second fin mask target marks 250 by a distance D2B. First fin mask target marks 225 are misaligned from second fin mask marks by the value |(D1B−D2B)−(D1A−D2A)|/2. Under perfect alignment between the three masks D1B=D2B=D1A=D2A. The best possible alignment when D1A, D2A, D1B and D2B are not equal occurs when D1A=D2B and D1B=D2A. Alignment systems of conventional photolithography tools may be adjusted to automatically position the gate mask relative to a substrate having the first and second fin mask targets marks misaligned to one another so that D1A=D2B and D1B=D2A.

Many other topological arrangements of first and second fin mask target marks 225 and 250 and gate mask alignment marks 330 using the principles of three mask alignment illustrated in FIGS. 20 and 21 and described supra are possible.

Figure 22:
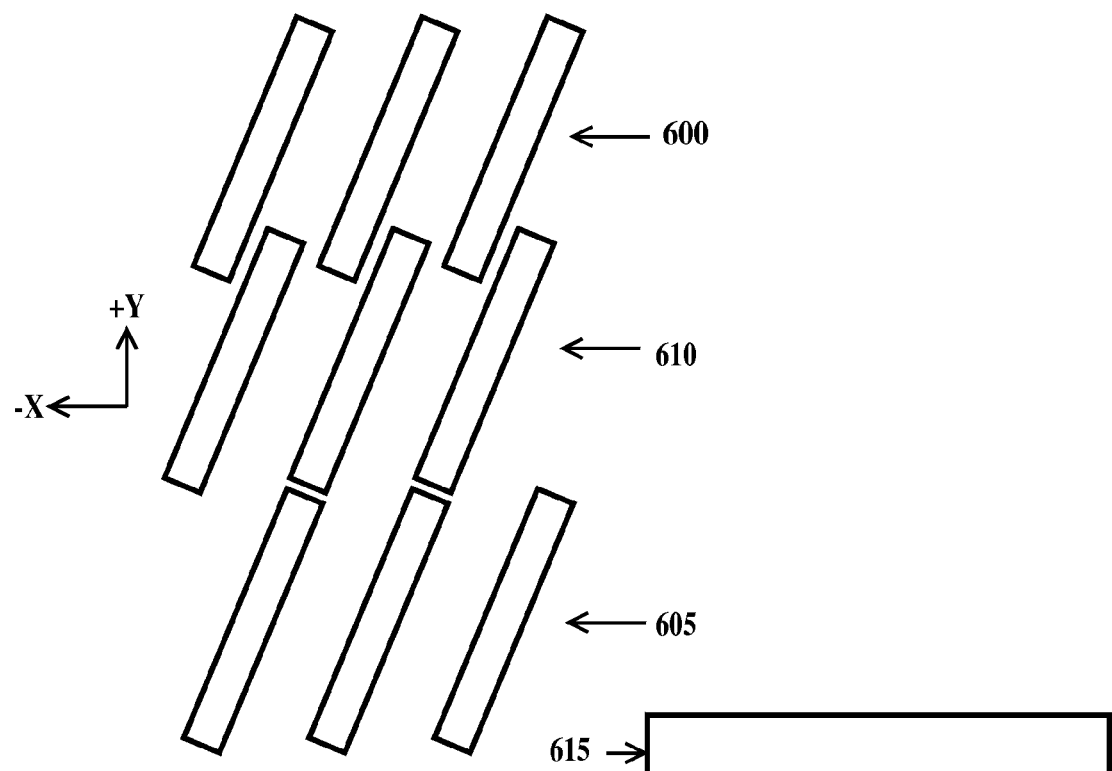
FIG. 22 illustrates a misalignment between sets of fin patterns defined by a first fin mask and sets of fin patterns defined by a second fin mask according to the present invention.

FIG. 22 illustrates a misalignment between sets of fin patterns defined by a first fin mask and sets of fin patterns defined by a second fin mask according to the present invention. While in FIGS. 3A and 13A fin patterns overlapped, in FIG. 22, fin patterns are misaligned and do not overlap. In FIG. 22, a first set of fin patterns 600 and a second fin patterns 606 are defined by a first fin mask. A third set of fin patterns 610 are defined by a second fin mask. The second fin mask has been misaligned in the +Y and −X directions relative to the first fin mask. Thus, there is no overlap of the ends of the fin patterns. It is also possible to overlap ends of just two of the three sets of fin patterns depending upon the degree of misalignment. However, assuming the misalignment is within specification, this has no impact on the present invention as may be seen from FIG. 23.

Figure 23:
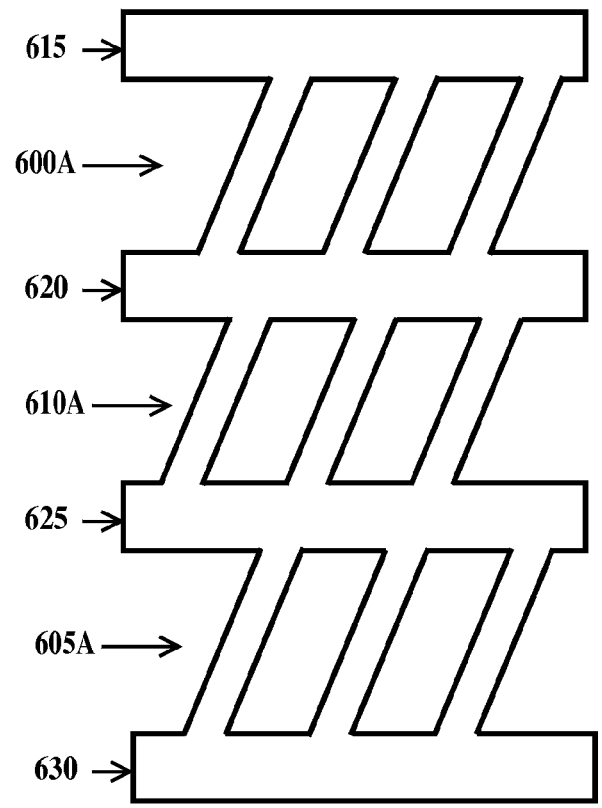
FIG. 23 illustrates the fin patterns of FIG. 22 as formed in single crystal silicon etched fins according to the present invention.

FIG. 23 illustrates the fin patterns of FIG. 22 as formed in single crystal silicon etched fins according to the present invention. In FIG. 23, fins 600A are integrally formed between and with silicon blocks 615 and 620, fins 610B are integrally formed between and with silicon blocks 620 and 625, and fins 605A are integrally formed between and with silicon blocks 625 and 630.

Thus, the present invention provides dense chevron finFET devices and methods of malting dense chevron finFET devices The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
   an insulating layer formed on a top surface of a supporting substrate;
   single-crystal silicon first and second fins on a top surface of said insulating layer;
   single-crystal silicon first, second and third blocks on said top surface of said insulating layer, said second block between said first and third blocks, said first fin between and connecting said first block to said second block, said second fin between and connecting said second block to said third block, said first, second and third blocks and said first and second fins integrally formed and having a same crystal structure;
   longitudinal axes of said first and second fins aligned in a first direction along a crystal plane of said crystal structure;
   longitudinal axes of said first, second, and third silicon blocks aligned parallel to each other in a second direction different from said first direction, said first and second directions about parallel to top surfaces of said first and second fins and top surfaces of said first, second and third blocks;
   a first dielectric cap on a top surface of said first fin and a second dielectric cap on a top surface of said second fin;
   a first gate dielectric layer on sidewalls of said first fin and on sidewalls and a top surface of said first dielectric cap and a second gate dielectric layer on sidewalls of said second fin and on sidewalls and a top surface of said second dielectric cap, a first gate electrode on said first gate dielectric layer and a second gate electrode on said second gate dielectric layer, a longitudinal axis of said first gate electrode not orthogonal to said longitudinal axis of said first fin and a longitudinal axis of said second gate electrode not orthogonal to said longitudinal axis of said second fin; and
   wherein said longitudinal axes of said first and second fins are aligned about parallel to respective {110} planes of said crystal structure.

2. The structure of claim 1, further including said first and second fins having respective first and second distal ends and said first, second and third blocks having opposite first and second sides, said first distal end of said first fin abutting said first side of said first block, said second distal end of said first fin abutting said first side of said second block, said first distal end of said second fin abutting said second side of said second block, and said second distal end of said second fin abutting said first side of said third block.

3. The structure of claim 1, further including:
   a first gate over said first fin and a second gate over said second fin, a longitudinal axis of said first gate rotated about 67.5° clockwise from said longitudinal axis of said first fin and a longitudinal axis of said second gate rotated about 67.5° clockwise from said longitudinal axis of said second fin, said longitudinal axis of said first gate about parallel to said longitudinal axis of said second gate.

4. The structure of claim 1, further including:
   single-crystal silicon third and fourth fins on said top surface of said insulating layer;
   said third fin between and connecting said first block to said second block, said fourth fin between and connecting said second block to said third block, said third and fourth fins integrally formed with having a same crystal structure as said first, second and third blocks and said first and second fins integrally formed and;
   longitudinal axes of said third and fourth fins aligned in said first direction.

5. The structure of claim 4, further including:
   said first gate electrode extending over said first and third fins and said second gate electrode extending over said second and fourth fins, longitudinal axes of said first and second gates parallel to each other.

6. A structure, comprising:
   an insulating layer formed on a top surface of a supporting substrate;
   single-crystal silicon first and second fins and first, second and third single-crystal silicon blocks integrally formed on a top surface of said insulating layer and having a same crystal structure, said second block between said first and third blocks, longitudinal axes of said first and second fins about parallel to a {100} plane of said crystal structure, said first fin between and connecting said first block to said second block, said second fin between and connecting said second block to said third block, said first, second and third blocks and said first and second fins integrally formed and having a same crystal structure; and
   single-crystal silicon third and fourth fins and fourth, fifth and sixth single-crystal silicon blocks integrally formed on said top surface of said insulating layer and having said same crystal structure, said fifth block between said fourth and sixth blocks, longitudinal axes of said third and fourth fins about parallel to a {110} plane of said crystal structure, said third fin between and connecting said fourth block to said fifth block, said fourth fin between and connecting said fifth block to said sixth block, said fourth, fifth and sixth blocks and said third and fourth fins integrally formed and having said same crystal structure.

7. The structure of claim 6, further including:
   a first gate dielectric layer on sidewalls and a top surface of said first fin and a second gate dielectric layer on sidewalls and a top surface of said second fin, a first gate electrode on said first gate dielectric layer and a second gate electrode on said second dielectric layer, a longitudinal axis of said first gate electrode rotated about 67.5° counterclockwise from said longitudinal axis of said first fin and a longitudinal axis of said second gate electrode rotated about 67.5° counterclockwise from said longitudinal axis of said second fin, said longitudinal axis of said first gate about parallel to said longitudinal axis of said second gate; and a third gate dielectric layer on sidewalls and a top surface of said third fin and a fourth gate dielectric layer on sidewalls and a top surface of said fourth fin, a third gate electrode on said third gate dielectric layer and a fourth gate electrode on said fourth dielectric layer, a longitudinal axis of said third gate electrode rotated about 67.5° clockwise from said longitudinal axis of said third fin and a longitudinal axis of said fourth gate rotated about 67.5° clockwise from said longitudinal axis of said fourth fin, said longitudinal axis of said third gate electrode about parallel to said longitudinal axis of said fourth gate electrode.

8. The structure of claim 7, further including:
a first source/drain in said first fin on a first side of said first gate and a second source/drain in said first fin on a second side of said first gate comprising a first N-type finFET;
a third source/drain in said second fin on a first side of said second gate and a fourth source/drain in said second fin on a second side of said second gate comprising a second N-type finFET;
a fifth source/drain in said third fin on a first side of said third gate and a sixth source/drain in said third fin on a second side of said third gate comprising a first P-type finFET; and
a seventh source/drain in said fourth fin on a first side of said fourth gate and an eighth source/drain in said fourth fin on a fourth side of said fourth gate comprising a second P-type finFET.

9. The structure of claim 6, further including:
a first dielectric cap on a top surface of said first fin and a second dielectric cap on a top surface of said second fin; and
a third dielectric cap on a top surface of said third fin and a fourth dielectric cap on a top surface of said fourth fin.

10. The structure of claim 9, further including:
a first gate dielectric layer on sidewalls of said first fin and a second gate dielectric layer on sidewalls of said second fin, a first gate electrode on said first gate dielectric layer and a second gate electrode on said second dielectric layer, a longitudinal axis of said first gate electrode rotated about 67.5° counterclockwise from said longitudinal axis of said first fin and a longitudinal axis of said second gate electrode rotated about 67.5° counterclockwise from said longitudinal axis of said second fin, said longitudinal axis of said first gate about parallel to said longitudinal axis of said second gate; and a third gate dielectric layer on sidewalls of said third fin and a fourth gate dielectric layer on sidewalls of said fourth fin, a third gate electrode on said third gate dielectric layer and a fourth gate electrode on said fourth dielectric layer, a longitudinal axis of said third gate electrode rotated about 67.5° clockwise from said longitudinal axis of said third fin and a longitudinal axis of said fourth gate rotated about 67.5° clockwise from said longitudinal axis of said fourth fin, said longitudinal axis of said third gate electrode about parallel to said longitudinal axis of said fourth gate electrode.

11. The structure of claim 10, further including:
a first source/drain in said first fin on a first side of said first gate and a second source/drain in said first fin on a second side of said first gate comprising a first N-type finFET;
a third source/drain in said second fin on a first side of said second gate and a fourth source/drain in said second fin on a second side of said second gate comprising a second N-type finFET;
a fifth source/drain in said third fin on a first side of said third gate and a sixth source/drain in said third fin on a second side of said third gate comprising a first P-type finFET; and
a seventh source/drain in said fourth fin on a first side of said fourth gate and an eighth source/drain in said fourth fin on a fourth side of said fourth gate comprising a second P-type finFET.

12. The structure of claim 9, further including:
a first gate dielectric layer on sidewalls of said first fin and on sidewalls and a top surface of said first dielectric cap;
a second gate dielectric layer on sidewalls of said second fin and sidewalls and a top surface of said second dielectric cap;
a first gate electrode on said first gate dielectric layer, a longitudinal axis of said first gate electrode rotated about 67.5° counterclockwise from said longitudinal axis of said first fin;
a second gate electrode on said second dielectric layer, a longitudinal axis of said second gate electrode rotated about 67.5° counterclockwise from said longitudinal axis of said second fin, said longitudinal axis of said first gate about parallel to said longitudinal axis of said second gate; and
a third gate dielectric layer on sidewalls of said third fin and on said third dielectric cap;
a fourth gate dielectric layer on sidewalls of said fourth fin and on said fourth dielectric cap;
a third gate electrode on said third gate dielectric layer, a longitudinal axis of said third gate electrode rotated about 67.5° clockwise from said longitudinal axis of said third fin; and
a fourth gate electrode on said fourth dielectric layer, a longitudinal axis of said fourth gate rotated about 67.5° clockwise from said longitudinal axis of said fourth fin, said longitudinal axis of said third gate electrode about parallel to said longitudinal axis of said fourth gate electrode.

13. The structure of claim 6, further including:
single-crystal silicon fifth and sixth fins on said top surface of said insulating layer and integrally formed with and having a same crystal structure as said first and second fins and said first, second and third blocks, longitudinal axes of said fifth and sixth fins about parallel to a {100} plane of said crystal structure, said fifth fin between and connecting said first block to said second block, said sixth fin between and connecting said second block to said third block; and
single-crystal silicon seventh and eighth fins on said top surface of said insulating layer and integrally formed with and having a same crystal structure as said third and fourth fins and said fourth, fifth and sixth blocks, longitudinal axes of said seventh and eighth fins about parallel to a {110} plane of said crystal structure, said seventh fin between and connecting said fourth block to said fifth block, said eighth fin between and connecting said fifth block to said sixth block.

14. The structure of claim 13, further including:
a first gate electrode extending over said first and fifth fins and a second gate electrode extending over said second and sixth fins, longitudinal axes of said first and second gate electrodes parallel to each other; and
a third gate electrode extending over said third and seventh fins and a fourth gate electrode extending over said fourth and eighth fins, longitudinal axes of said third and fourth gate electrodes parallel to each other.

* * * * *